US012243883B2

(12) United States Patent
Pyo et al.

(10) Patent No.: US 12,243,883 B2
(45) Date of Patent: Mar. 4, 2025

(54) IMAGE SENSOR COMPRISING A PIXEL ARRAY INCLUDING FIRST PIXEL GROUPS AND SECOND PIXEL GROUPS WITH CORRESPONDING MICROLENSES OF DIFFERENT SIZES FOR AUTOFOCUSING

(71) Applicant: SAMSUNG ELECTRONICS CO., LTD., Suwon-si (KR)

(72) Inventors: Junghyung Pyo, Seoul (KR); Jungbin Yun, Hwaseong-si (KR); Kyungho Lee, Suwon-si (KR); Seungjoon Lee, Busan (KR); Wooseok Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 473 days.

(21) Appl. No.: 17/572,180

(22) Filed: Jan. 10, 2022

(65) Prior Publication Data
US 2022/0344389 A1 Oct. 27, 2022

(30) Foreign Application Priority Data
Apr. 21, 2021 (KR) .................. 10-2021-0051595

(51) Int. Cl.
*H01L 27/146* (2006.01)
*H04N 25/704* (2023.01)

(52) U.S. Cl.
CPC .. *H01L 27/14605* (2013.01); *H01L 27/14621* (2013.01); *H01L 27/14627* (2013.01);
(Continued)

(58) Field of Classification Search
CPC ......... H01L 27/14605; H01L 27/14621; H01L 27/14627; H01L 27/1463; H01L 27/1464;
(Continued)

(56) References Cited

U.S. PATENT DOCUMENTS 8,446,498 B2 5/2013 Ishiwata et al.
10,431,619 B2 10/2019 Masagaki et al.
(Continued)

FOREIGN PATENT DOCUMENTS

JP 2017-162985 A 9/2017
JP 2018-182022 11/2018
(Continued)

OTHER PUBLICATIONS

Office Action dated Jan. 21, 2025 issued by the Japanese Patent Office in Japanese Application No. 2022-038283.

*Primary Examiner* — Jennifer D Bennett
(74) *Attorney, Agent, or Firm* — Sughrue Mion, PLLC

(57) ABSTRACT

An image sensor is provided. The image sensor includes: a pixel array including first and second pixel groups, each of which includes unit pixels arranged in 4×4 array, each of the unit pixels including a photodiode provided, and the first and second pixel groups being alternately disposed in multiple directions; a logic circuit configured to acquire pixel signals from the unit pixels; first microlenses provided on corresponding unit pixels in the first pixel groups; and second microlenses provided on four corresponding unit pixels of the unit pixels included in the second pixel groups. Each of the first and second pixel groups includes a device isolation layer provided between the unit pixels, and a color filter provided on the first surface, and each of the second pixel groups includes an overflow region configured to move electrical charges between adjacent photodiodes.

15 Claims, 29 Drawing Sheets

(52) U.S. Cl.
CPC ...... *H01L 27/1463* (2013.01); *H01L 27/1464* (2013.01); *H01L 27/14645* (2013.01); *H01L 27/14685* (2013.01); *H01L 27/14689* (2013.01); *H04N 25/704* (2023.01)

(58) Field of Classification Search
CPC ......... H01L 27/14645; H01L 27/14685; H01L 27/14689; H01L 27/14603; H01L 27/14612; H01L 27/14643; H01L 27/14609; H04N 25/704; H04N 25/76
See application file for complete search history.

(56) References Cited

U.S. PATENT DOCUMENTS

| | | |
|---|---|---|
| 10,484,627 B2 | 11/2019 | Zhou |
| 2017/0263664 A1 | 9/2017 | Koizumi et al. |
| 2018/0350856 A1* | 12/2018 | Masagaki ............... G02B 7/34 |
| 2020/0112671 A1 | 4/2020 | Kang et al. |
| 2020/0119073 A1 | 4/2020 | Machida et al. |
| 2020/0235149 A1 | 7/2020 | Shiraishi et al. |
| 2020/0358989 A1 | 11/2020 | Hoshino |
| 2021/0028204 A1 | 1/2021 | Fujita et al. |

FOREIGN PATENT DOCUMENTS

| | | |
|---|---|---|
| JP | 2021-22728 A | 2/2021 |
| KR | 10-2020-0090763 A | 7/2020 |
| WO | 2017/130723 A1 | 8/2017 |
| WO | 2019/012887 A1 | 5/2019 |

\* cited by examiner

IMAGE SENSOR COMPRISING A PIXEL ARRAY INCLUDING FIRST PIXEL GROUPS AND SECOND PIXEL GROUPS WITH CORRESPONDING MICROLENSES OF DIFFERENT SIZES FOR AUTOFOCUSING

CROSS-REFERENCE TO RELATED APPLICATION(S)

This application claims priority to Korean Patent Application No. 10-2021-0051595 filed on Apr. 21, 2021 in the Korean Intellectual Property Office, the disclosure of which is incorporated by reference herein in its entirety.

BACKGROUND

Methods, apparatuses and systems consistent with example embodiments relate to an image sensor.

Image sensors may be semiconductor-based devices that generate electrical signals upon receiving light, may include a pixel array including a plurality of unit pixels and a circuit for driving the pixel array and generating an image. Each of the plurality of unit pixels may include a photodiode which generates an electrical charge in response to external light that is incident thereon, and a pixel circuit which converts the electrical charge generated by the photodiode into an electric signal. The image sensor may be widely applied to smartphones, tablet PCs, laptop computers, televisions, automobiles, and the like, in addition to cameras for capturing images or video. Recently, research to improve autofocusing performance along with research to create high-quality images, has been conducted.

SUMMARY

One or more example embodiments provide an improved image sensor for securing autofocusing with respect to four directions, preventing saturation of electrical charges generated by a photodiode, and generating a high-quality image.

According to an aspect of an example embodiment, an image sensor includes: a substrate having a first surface and a second surface which faces the first surface; a pixel array including a plurality of first pixel groups and a plurality of second pixel groups, each of the plurality of first pixel groups and each of the plurality of second pixel groups including a plurality of unit pixels arranged in 4×4 array that extends in a second direction and in a third direction, each of the plurality of unit pixels including a photodiode provided in the substrate, and the plurality of first pixel groups and the plurality of second pixel groups being alternately disposed in the second direction and in the third direction; a logic circuit configured to acquire pixel signals from the plurality of unit pixels; a plurality of first microlenses, each of which is provided on a corresponding unit pixel of the plurality of unit pixels included in the plurality of first pixel groups; and a plurality of second microlenses, each of which is respectively provided on four corresponding unit pixels of the plurality of unit pixels included in the plurality of second pixel groups that are arranged in a 2×2 array. A first direction is perpendicular to the first surface of the substrate, the second direction is parallel to the first surface of the substrate, and the third direction is parallel to the first surface of the substrate and perpendicular to the second direction. Each of the plurality of first pixel groups and each of the plurality of second pixel groups includes a device isolation layer provided between the plurality of unit pixels, and a color filter provided on the first surface, and each of the plurality of second pixel groups includes an overflow region configured to move electrical charges between adjacent photodiodes.

According to an aspect of an example embodiment, an image sensor includes: a substrate having a first surface and a second surface which faces the first surface; a pixel array including a plurality of subpixel groups including a plurality of first subpixel groups and a plurality of second subpixel groups, each of the plurality of first subpixel groups and each of the plurality of second subpixel groups including a plurality of unit pixels arranged in a 2×2 array that extends in a second direction and in a third direction, and a floating diffusion region that is shared by the plurality of unit pixels arranged in the 2×2 array, and each of the plurality of unit pixels including a photodiode provided in the substrate; a logic circuit configured to acquire pixel signals from the plurality of unit pixels; a plurality of first microlenses, each of which is provided on a corresponding unit pixel of the plurality of unit pixels included in the plurality of first subpixel groups; and a plurality of second microlenses, each of which is respectively provided on a plurality of corresponding unit pixels of the plurality of second subpixel groups. A first direction is perpendicular to the first surface of the substrate, the second direction is parallel to the first surface of the substrate, and the third direction is parallel to the first surface of the substrate and perpendicular to the second direction. Each of the plurality of subpixel groups is adjacent to one of the plurality of first subpixel groups and one of the plurality of second subpixel groups in each of the second direction and the third direction, and includes a device isolation layer provided between the plurality of unit pixels and separated from the floating diffusion region in the second direction and in the third direction, and adjacent portions of the device isolation layer extending in the second direction in the plurality of first subpixel groups are closer to each other than adjacent portions of the device isolation layer extending in the second direction in the plurality of second subpixel groups.

According to an aspect of an example embodiment, an image sensor includes: a substrate having a first surface and a second surface which faces the first surface; a pixel array including a plurality of first pixel groups and a plurality of second pixel groups, each of the plurality of first pixel groups and the plurality of second pixel groups including a plurality of unit pixels defined by a device isolation layer extending through the substrate in a first direction, the plurality of unit pixels in each of the plurality of first pixel groups and the plurality of second pixel groups being arranged in 4×4 array that extends in a second direction and in a third direction, each of the plurality of unit pixels including a photodiode provided inside the substrate, and the plurality of first pixel groups and the plurality of second pixel groups being alternately disposed in the second direction and in the third direction; a logic circuit configured to acquire pixel signals from the plurality of unit pixels; a plurality of first microlenses having a first diameter and respectively corresponding to the plurality of unit pixels are disposed on an upper surface of the plurality of first pixel groups; and a plurality of second microlenses having a second diameter greater than the first diameter are disposed on an upper surface of the plurality of second pixel groups. The first direction is perpendicular to the first surface of the substrate, the second direction is parallel to the first surface of the substrate, and the third direction is parallel to the first surface of the substrate and perpendicular to the second direction, and a pixel signal acquired from unit pixels of the plurality of unit pixels sharing one of the plurality of second microlenses includes an autofocusing pixel signal with respect to the second direction and the third direction.

BRIEF DESCRIPTION OF DRAWINGS

The above and other aspects, features, and advantages will be more clearly understood from the following detailed description, taken in conjunction with the accompanying drawings, in which.

DETAILED DESCRIPTION

Hereinafter, example embodiments will be described with reference to the accompanying drawings.

Figure 1:
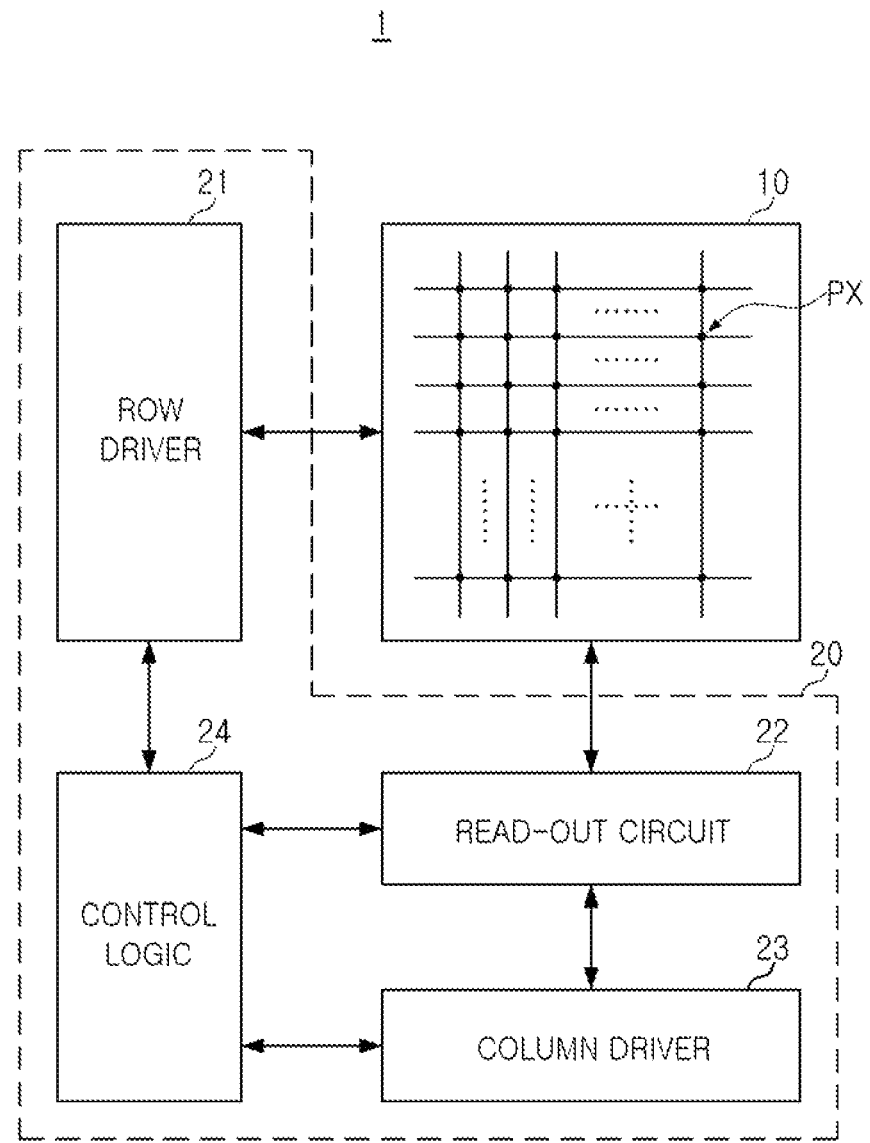
FIG. 1 is a block diagram illustrating an image sensor according to an example embodiment.

FIG. 1 is a block diagram illustrating an image sensor according to an example embodiment.

Referring to FIG. 1, an image sensor 1 according to an example embodiment may include a pixel array 10 and a logic circuit 20.

The pixel array 10 may include a plurality of unit pixels PX arranged in a plurality of rows and a plurality of columns. Each of the unit pixels PX may include at least one photoelectric conversion element which generates an electrical charge in response to light that is incident thereon, and a pixel circuit which generates a pixel signal corresponding to the electrical charge generated by the photoelectric conversion element.

The photoelectric conversion device may include a photodiode formed of a semiconductor material and/or an organic photodiode formed of an organic material. In an example embodiment, each of the unit pixels PX may include two or more photoelectric conversion elements, and the two or more photoelectric conversion elements included in one unit pixel PX may receive light of different colors and generate electrical charges. In an example embodiment, each of the plurality of unit pixels PX may include a photodiode which generates an electrical charge upon receiving light. However, this is an example and example embodiments are not limited thereto.

According to an example embodiment, the pixel circuit may include a transfer transistor, a driving transistor, a select transistor, and a reset transistor. When each of the unit pixels PX includes one photoelectric conversion element, each of the unit pixels PX may include a pixel circuit for processing electrical charges generated by the photoelectric conversion element. For example, each of the plurality of unit pixels PX included in the image sensor 1 according to an example embodiment may include a photodiode. Accordingly, a pixel circuit corresponding to each of the unit pixels PX may include a transfer transistor, a driving transistor, a select transistor, and a reset transistor.

However, this is only an example and embodiments are not limited thereto. For example, the plurality of unit pixels PX included in the image sensor 1 according to an example embodiment may share a floating diffusion region in units of subpixel groups, and accordingly, at least some of the photoelectric conversion elements may share some of the drive transistor, the select transistor, and the reset transistor.

The logic circuit 20 may include circuits for controlling the pixel array 10. For example, the logic circuit 20 may include a row driver 21, a read-out circuit 22, a column driver 23, and a control logic 24.

The row driver 21 may drive the pixel array 10 in a row unit. For example, the row driver 21 may generate a transfer control signal for controlling the transfer transistor of the pixel circuit, a reset control signal for controlling the reset transistor, a select control signal for controlling the select transistor, and the like and input the generated signals to the pixel array 10 in units of rows.

The read-out circuit 22 may include a correlated double sampler (CDS), an analog-to-digital converter (ADC), and the like. The CDSs may be connected to the unit pixels PX through column lines. The CDSs may perform correlated double sampling by receiving pixel signals from unit pixels PX connected to a row line selected by a row line select signal from the row driver 21. The pixel signals may be received via the column lines. The ADC may convert the pixel signal detected by the CDS into a digital pixel signal and transmit the digital pixel signal to the column driver 23.

The column driver 23 may include a latch or buffer circuit for temporarily storing a digital pixel signal, an amplifier circuit, and the like, and may process a digital pixel signal received from the read-out circuit 22. The row driver 21, the read-out circuit 22, and the column driver 23 may be controlled by the control logic 24. The control logic 24 may include a timing controller for controlling an operation timing of the row driver 21, the read-out circuit 22, and the column driver 23.

Among the unit pixels PX, the unit pixels PX arranged at the same position in the horizontal direction may share the same column line. For example, unit pixels PX arranged at the same position in the vertical direction may be simultaneously selected by the row driver 21 and may output pixel signals through column lines. In an example embodiment, the read-out circuit 22 may simultaneously acquire pixel signals from the unit pixels PX selected by the row driver 21 through column lines. The pixel signal may include a reset voltage and a pixel voltage, and the pixel voltage may be a voltage in which an electrical charge generated in response to light in each of the unit pixels PX is reflected in the reset voltage. However, example embodiments are not limited to the components described above with reference to FIG. 1, and the image sensor may additionally include other components and may be driven in various manners.

Figure 2:
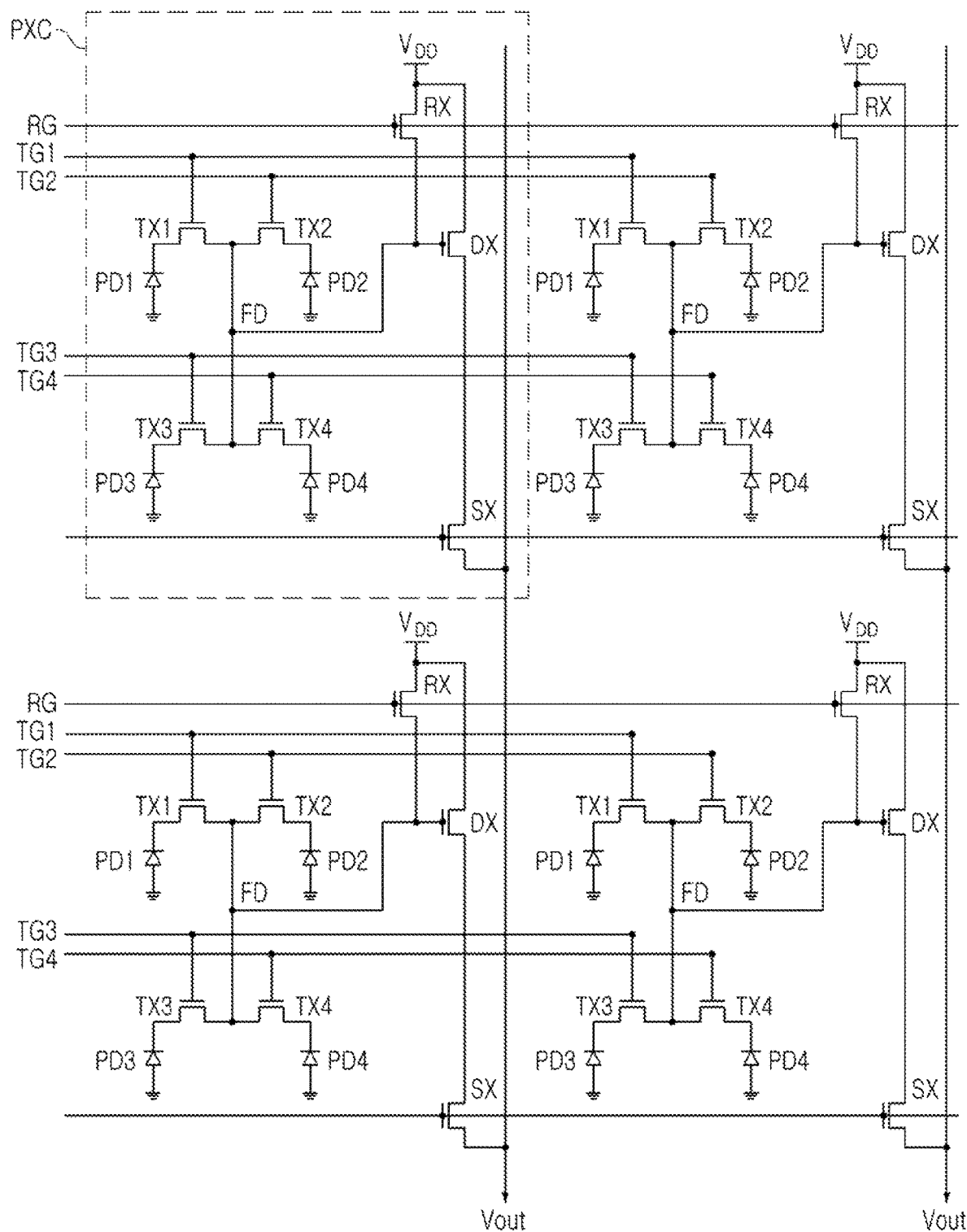
FIG. 2 is a circuit diagram illustrating a pixel circuit of an image sensor according to an example embodiment.

FIG. 2 is a circuit diagram illustrating a pixel circuit of an image sensor according to an example embodiment.

A plurality of unit pixels PX included in the image sensor 1 according to an example embodiment may be grouped into subpixel groups. For example, one subpixel group may include four unit pixels PX.

The image sensor 1 according to an example embodiment may include a plurality of subpixel groups, each of which includes a plurality of unit pixels PX. Referring to FIG. 2, one of the plurality of unit pixels PX, pixel circuit PXC, of one of the plurality of subpixel groups may include photodiodes PD1, PD2, PD3, and PD4 and a plurality of semiconductor devices for processing electrical charges generated by the photodiodes PD1, PD2, PD3, and PD4. Each of the pixels of each of the subpixel groups may include similar components.

For example, the pixel circuit PXC may include first to fourth photodiodes PD1 to PD4, first to fourth transfer transistors TX1 to TX4, a reset transistor RX, a select transistor SX, and a driving transistor DX. The first to fourth photodiodes PD1 to PD4 included in the pixel circuit PXC may share a floating diffusion region FD, a reset transistor RX, a select transistor SX, and a driving transistor DX. Gate electrodes of the first to fourth transfer transistors TX1 to TX4, the reset transistor RX, and the select transistor SX may be respectively connected to the driving signal lines TG1 to TG4, RG, and SG. However, this is only an example, and example embodiments are not limited to that illustrated in FIG. 2, and the pixel circuit PXC may be designed in various manners.

In an example embodiment, any one pixel circuit PXC may generate a first electrical signal from the electrical charges generated by the photodiodes PD1 to PD4 included in the corresponding pixel circuit PXC and output the first electric signal to the first column line, and another pixel circuit may generate a second electrical signal from the electrical charges generated by the photodiodes PD1 to PD4 included in the corresponding pixel circuit and output the second electrical signal to the second column line. According to an example embodiment, two or more pixel circuits disposed adjacent to each other may share one first column line. Similarly, two or more other pixel circuits disposed adjacent to each other may share one second column line. Pixel circuits disposed adjacent to each other may share some semiconductor devices.

The first to fourth transfer transistors TX1 to TX4 may be connected to the first to fourth transfer gates TG1 to TG4 and the first to fourth photodiodes PD1 to PD4, respectively. The first to fourth transfer transistors TX1 to TX4 may share the floating diffusion region FD. The first to fourth photodiodes PD1 to PD4 may generate electrical charges in proportion to the amount of externally incident light and accumulate the electrical charges therein.

The first to fourth transfer transistors TX1 to TX4 may sequentially transfer electrical charges accumulated in the first to fourth photodiodes PD1 to PD4 to the floating diffusion region FD. In order to transfer electrical charges generated by any one of the first to fourth photodiodes PD1 to PD4 to the floating diffusion region FD, different signals may be applied to the first to fourth transfer gates TG1 to TG4. Accordingly, the floating diffusion region FD may accumulate electrical charges generated by any one of the first to fourth photodiodes PD1 to PD4.

The reset transistor RX may periodically reset the electrical charges accumulated in the floating diffusion region FD. For example, electrodes of the reset transistor RX may be connected to the floating diffusion region FD and a power supply voltage $V_{DD}$. When the reset transistor RX is turned on, the electrical charges accumulated in the floating diffusion region FD may be discharged due to a potential difference with the power supply voltage $V_{DD}$ so the floating diffusion region FD may be reset and a voltage of the floating diffusion region FD may be equal to the power supply voltage $V_{DD}$.

An operation of the driving transistor DX may be controlled according to the amount of electrical charges accumulated in the floating diffusion region FD. The driving transistor DX may serve as a source-follower buffer amplifier in combination with a current source disposed outside the unit pixel PX. For example, the driving transistor DX may amplify a potential change based on the electrical charges accumulated in the floating diffusion region FD and output the amplified potential change to an output line Vout.

The select transistor SX may select the unit pixels PX to be read in row units. When the select transistor SX is turned on, an electrical signal output from the driving transistor DX may be transmitted to the select transistor SX.

The image sensor 1 according to an example embodiment may provide autofocusing in at least one of the plurality of subpixel groups including a plurality of unit pixels sharing the floating diffusion region FD based on the pixel circuit PXC illustrated in FIG. 2. For example, the image sensor 1 may provide autofocusing in four directions (e.g., an up-down direction and a left-right direction) using the first photodiode PD1 to the fourth photodiode PD4.

As an example, the logic circuit may provide autofocusing in the left-right direction using a first pixel signal acquired after the first transfer transistor TX1 is turned on and a second pixel signal acquired after the second transfer transistor TX2 is turned on. The logic circuit may provide autofocusing in the up-down direction using the first pixel signal acquired after the first transfer transistor TX1 is turned on and a third pixel signal acquired after the third transfer transistor TX3 is turned on. However, the pixel circuit of the unit pixel providing the autofocusing is not necessarily limited to the one illustrated in FIG. 2, and some elements may be added or omitted as necessary.

Figure 3:
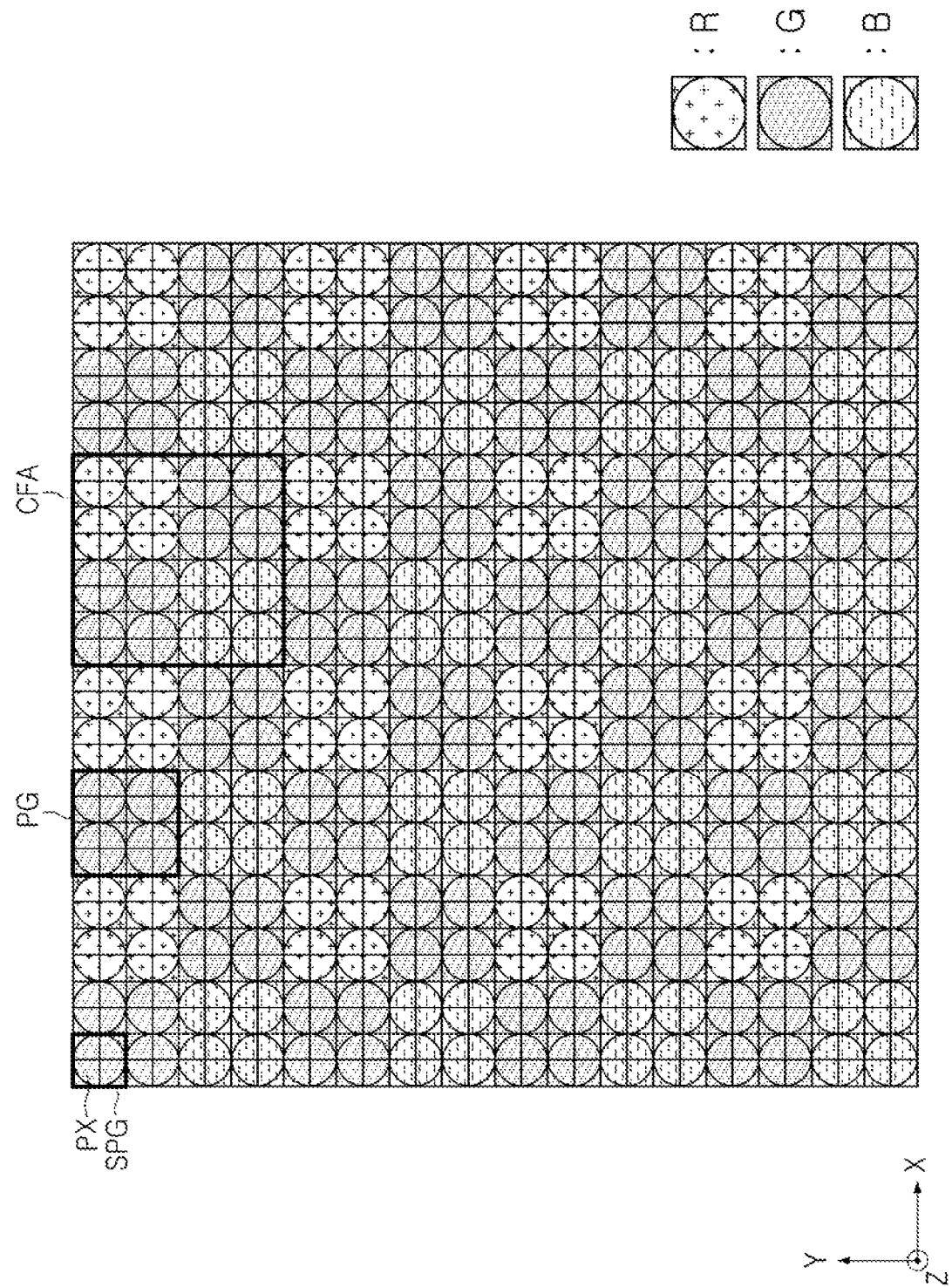
FIGS. 3 and 4 are plan views illustrating a pixel array included in an image sensor.
Figure 4:
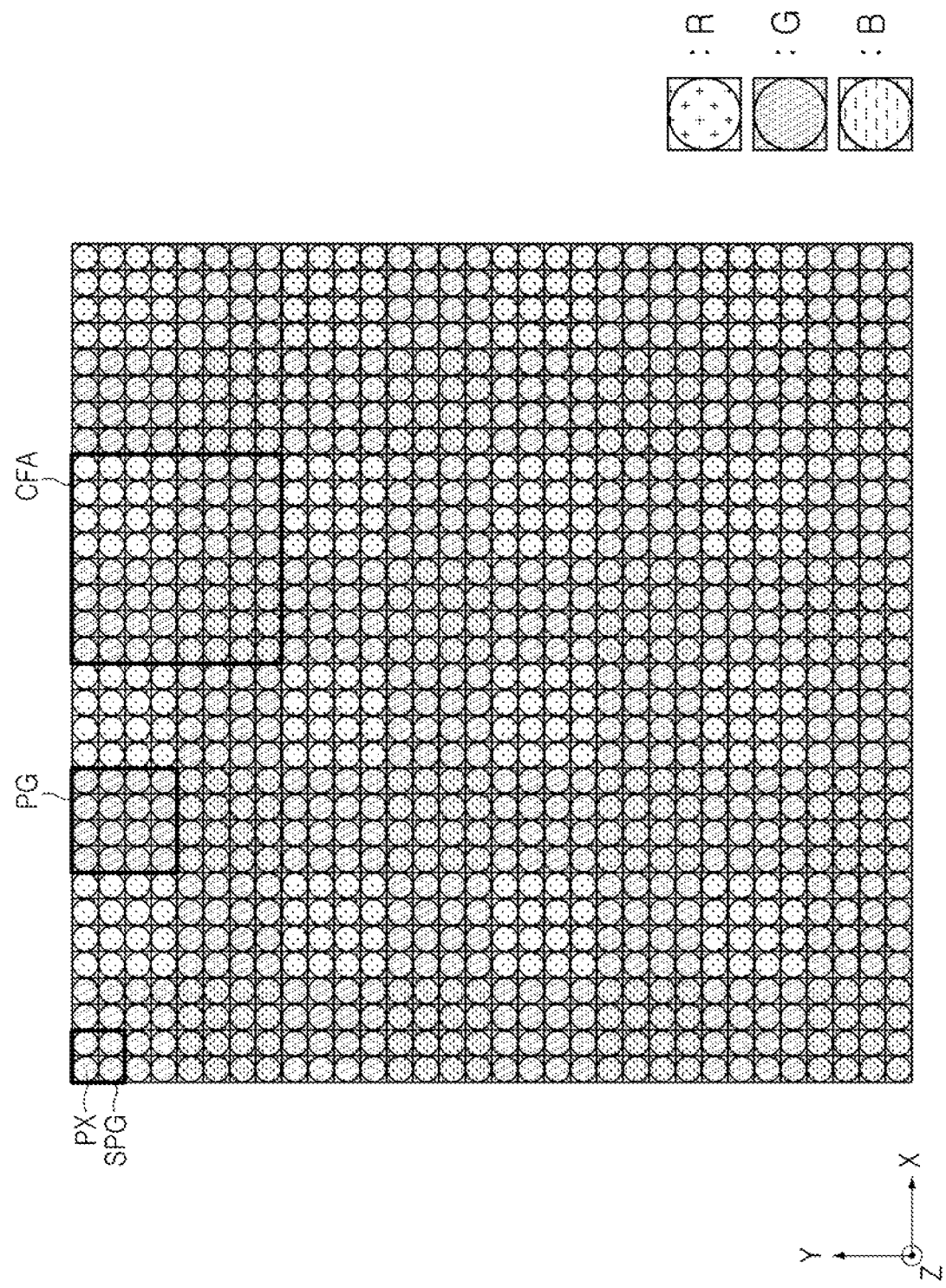

FIGS. 3 and 4 are plan views illustrating pixel arrays included in an image sensor.

Referring to FIGS. 3 and 4, pixel arrays included in an image sensor may include a plurality of unit pixels PX. For example, 2×2 arrays of the plurality of unit pixels PX may constitute subpixel groups SPG. 2×2 arrays of the plurality of subpixel groups SPG may constitute pixel groups PG. For example, a color filter of the same color may be provided on each of the unit pixels PX in a pixel group PG. In other words, the pixel arrays may include a plurality of pixel groups PG, each of which corresponds to a color filter, and each of the plurality of pixel groups PG may include a plurality of unit pixels PX arranged in 4×4 form.

The color filters disposed on the plurality of pixel groups PG may have any one of red (R), green (G), and blue (B) colors. For example, the pixel array of the image sensor may include color filters forming a color filter array CFA repeatedly arranged in the order of green, red, blue, and green to correspond to a plurality of pixel groups PG arranged in a 2×2 form.

In an image sensor, each of the plurality of unit pixels PX included in pixel arrays may include a photodiode. The plurality of unit pixels PX may include a microlens on which light is incident in order to generate an electrical signal from the photodiode at the top thereof.

Referring to FIG. 3, in the pixel array of the image sensor, a microlens may be disposed to correspond to each of the plurality of subpixel groups SPG. For example, a plurality of unit pixels PX arranged in a 2×2 form may share one microlens.

A plurality of unit pixels PX sharing one microlens may function as an autofocusing pixel. For example, the plurality of photodiodes included in each of the plurality of unit pixels PX may be arranged in a second direction (e.g., an X-direction), perpendicular to a first direction (e.g., Z direction) in which the microlens is disposed, and in a third direction (e.g., Y-direction), perpendicular to the first direction and the second direction. The image sensor may perform autofocusing in the second direction using a pixel signal acquired from two unit pixels PX arranged side by side in the second direction and may perform autofocusing in the third direction using a pixel signal acquired from two unit pixels PX arranged side by side in the third direction. Accordingly, the image sensor including the pixel array illustrated in FIG. 3 may perform autofocusing in four directions.

However, because the plurality of unit pixels PX included in one subpixel group SPG share one microlens, light incident on one microlens may be divided to be incident on four unit pixels PX. For example, light that passes through one microlens may be affected by reflection and refraction. Accordingly, in the image sensor having the pixel array illustrated in FIG. 3, a remosaic process entailing a complicated correction and a large amount of power consumption may be performed and an image having relatively low resolution may be generated, compared to an image sensor in which each of the plurality of unit pixels PX includes a microlens.

Referring to FIG. 4, in the pixel array of the image sensor, a microlens may be disposed to correspond to each of the plurality of unit pixels PX. For example, one subpixel group SPG that includes unit pixels PX arranged in a 2×2 form may include microlenses that are also arranged in a 2×2 form.

The image sensor including the pixel array illustrated in FIG. 4 does not require a re-mosaic in an image generating process, and thus, an image having a relatively high resolution may be generated. However, light incident between the microlenses may be reflected and optical loss may occur in connection with image generation of the image sensor. In addition, because the image sensor is configured such that the photodiodes and the microlenses correspond to each other, there may be a problem in that the autofocusing cannot be performed.

Figure 5:
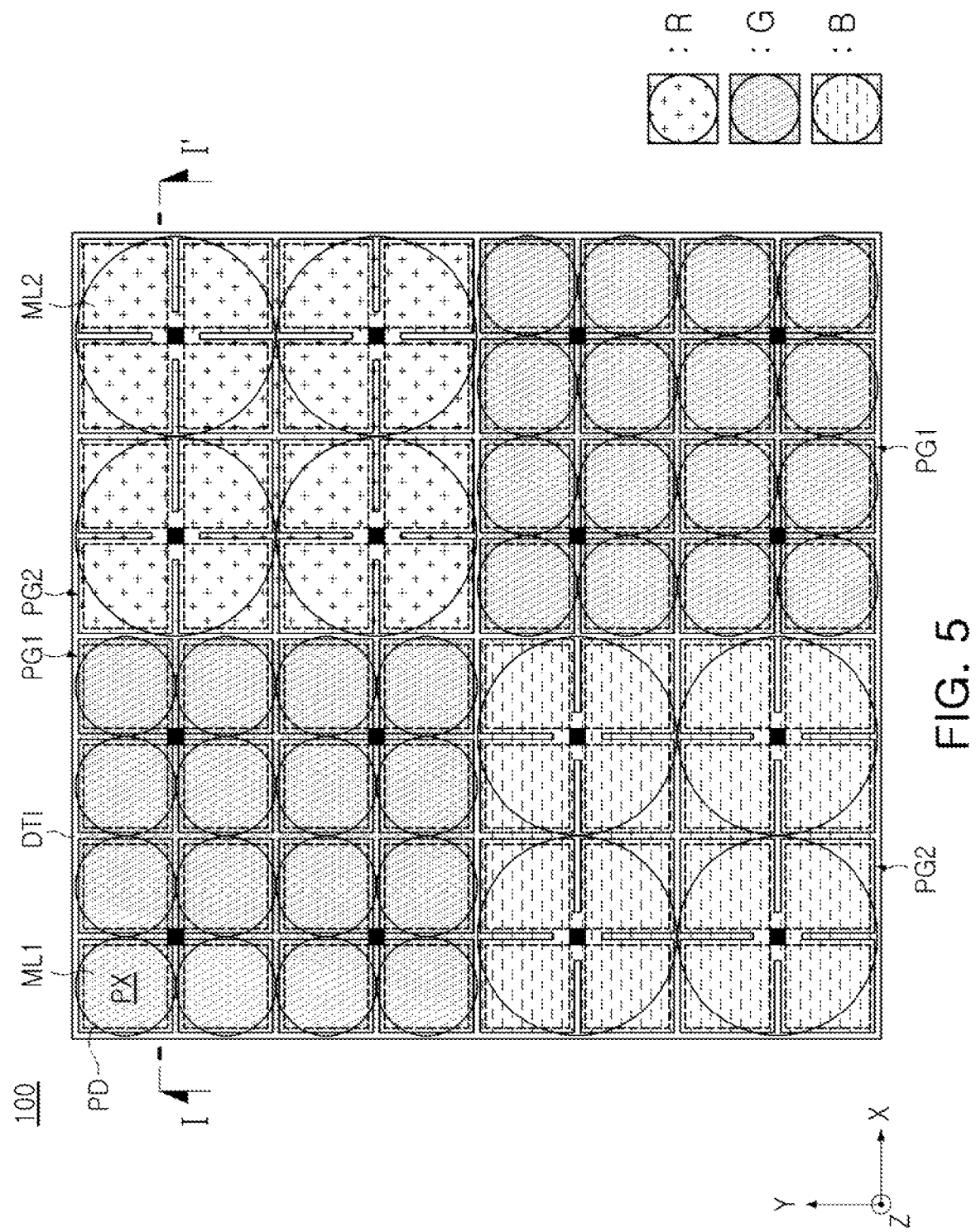
FIG. 5 is a plan view illustrating pixel groups included in an image sensor according to an example embodiment.

FIG. 5 is a plan view illustrating pixel groups included in an image sensor according to an example embodiment.

FIG. 5 is a diagram illustrating pixel groups PG1 and PG2 corresponding to one color filter array included in the image sensor 100 and components thereof according to an example embodiment. For example, one color filter array may include four pixel groups PG1 and PG2, and each of the pixel groups PG1 and PG2 in the first direction (e.g., the Z direction) may include a color filter having a predetermined color.

Referring to FIG. 5, in the image sensor 100 according to an example embodiment, each of the pixel groups PG1 and PG2 may include a plurality of unit pixels PX arranged in 4×4 form. The pixel groups PG1 and PG2 may include first pixel groups PG1 and second pixel groups PG2. The first pixel groups PG1 and the second pixel groups PG2 may be alternately arranged with each other in the second direction (e.g., the X-direction), perpendicular to the first direction, and in the third direction (e.g., the Y-direction), perpendicular to the first direction and the second direction.

According to the example embodiment illustrated in FIG. 5, both of the plurality of first pixel groups PG1 may include a green color filter, one of the plurality of second pixel groups PG2 may include a red color filter, and another one of the plurality of second pixel groups PG2 may include a blue color filter.

The plurality of unit pixels PX included in each of the pixel groups PG1 and PG2 may be defined by a device isolation layer DTI disposed therebetween, and each of the plurality of unit pixels PX isolated by the device isolation layer DTI may include a photodiode PD. Each of the pixel groups PG1 and PG2 may include a microlens ML disposed on the color filter. The microlens ML may include a first microlens ML1 and a second microlens ML2. The first microlens ML1 and the second microlens ML2 may be disposed on top of the plurality of unit pixels PX in the first direction to allow external light to be incident thereon.

For example, the first pixel groups PG1 may include a first microlens ML1 corresponding to each of the plurality of unit pixels PX (16 total first microlenses ML1 in each first pixel group PG1), and the second pixel group PG2 may include a second microlens ML2 shared by a plurality of unit pixels PX arranged in a 2×2 form (four total microlenses ML2 in each second pixel group PG2). For example, the first microlens ML1 may have a first diameter, and the second microlens ML2 may have a second diameter greater than the first diameter. In an example, the second diameter may be twice the first diameter. However, this is an example and example embodiments are not limited thereto. For example, as long as the first microlens ML1 corresponds to the plurality of unit pixels PX and the second microlens ML2 corresponds to the subpixel group, the diameter and shape of the first microlens ML1 and the second microlens ML2 may vary according to example embodiments.

Because the first microlens ML1 corresponds to one unit pixel PX, the plurality of unit pixels PX included in the first pixel group PG1 cannot operate as an autofocusing pixel. However, an image generated using a pixel signal acquired from the plurality of unit pixels PX included in the first pixel group PG1 does not require a separate re-mosaic process and thus may have a relatively high resolution.

Because the second microlens ML2 corresponds to the unit pixels PX arranged in a 2×2 form, the plurality of unit pixels PX included in the second pixel group PG2 may act as an autofocusing pixel. For example, a pixel signal acquired from a plurality of unit pixels PX sharing one of the second microlenses ML2 may include an autofocusing pixel signal. The plurality of unit pixels PX included in the second pixel group PG2 may perform an autofocusing in four directions, i.e., in the up-down direction and the left-right direction. In addition, the image sensor 100 may reduce optical loss using structural features of the second microlens ML2 included in the second pixel group PG2.

The image sensor 100 according to an example embodiment uses both the first microlens ML1 and the second microlens ML2 having different diameters, thereby generating an image, to which the autofocusing is applied and which has relatively high resolution, while calibration required for generating an image and power consumption are reduced.

Figure 6:
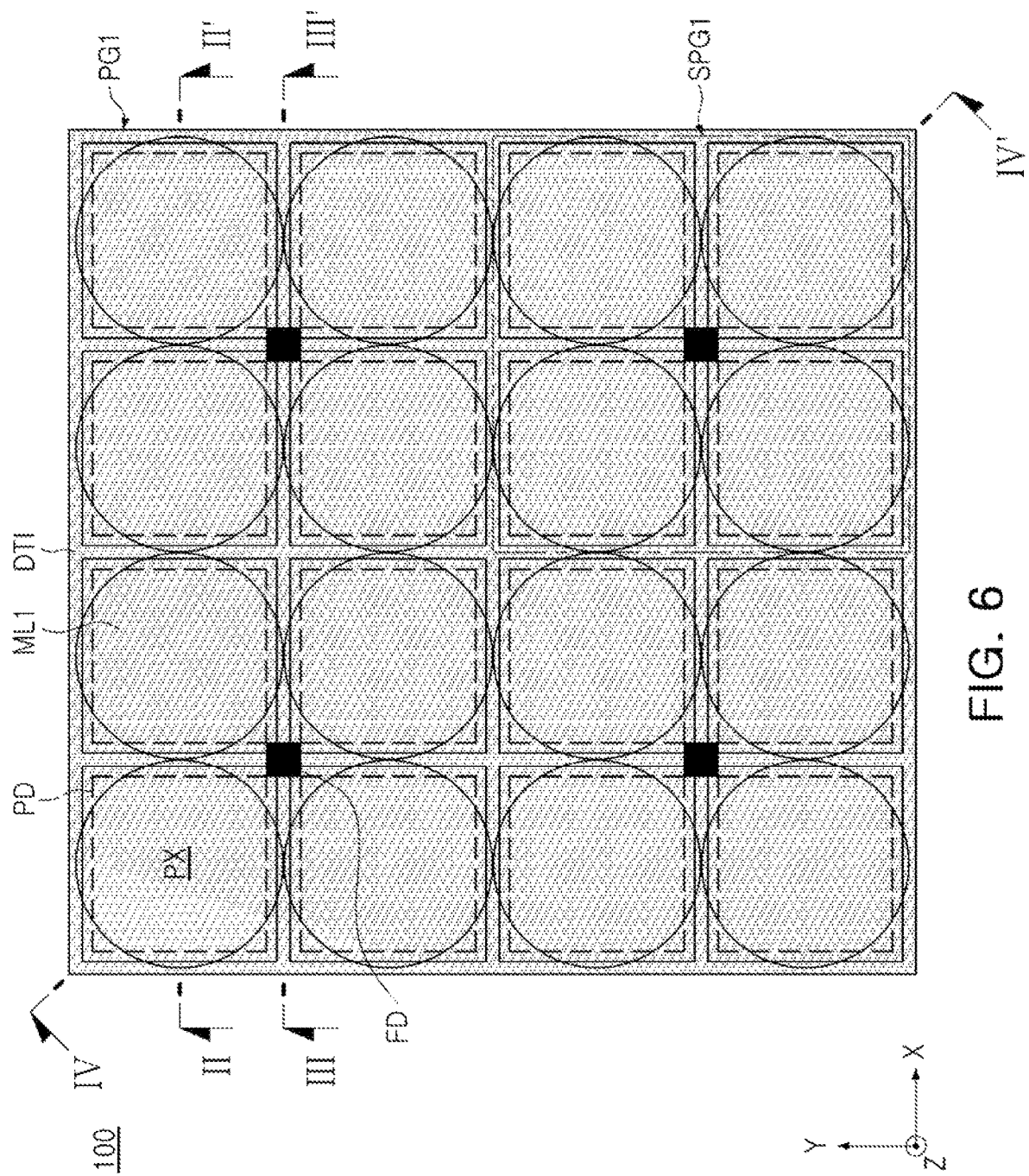
FIG. 6 is a plan view illustrating a first pixel group included in an image sensor according to an example embodiment.

FIG. 6 is a plan view illustrating a first pixel group included in an image sensor according to an example embodiment.

Referring to FIG. 6, in the image sensor 100 according to an example embodiment, the first pixel group PG1 may include a plurality of unit pixels PX sharing the floating diffusion region FD and a plurality of first subpixel groups SPG1 arranged in a 2×2 form. For example, each of the plurality of first subpixel groups SPG1 may include a plurality of unit pixels PX arranged in a 2×2 form.

The first pixel group PG1 may include a color filter having a predetermined color. For example, the color filter included in the first pixel group PG1 may be green. However, this is only an example, and example embodiments are not limited thereto, and the color of the color filter may vary.

Each of the plurality of unit pixels PX may include a photodiode PD which generates an electrical signal by receiving external light. The plurality of unit pixels PX may include first microlenses ML1 corresponding the plurality of unit pixels PX, respectively. For example, the center of the first microlens ML1 may overlap the photodiode PD in the first direction (e.g., the Z direction).

The plurality of unit pixels PX may be defined by a device isolation layer DTI extending in the first direction. The device isolation layers DTI may be separated from each other in the second direction (e.g., the X-direction), perpendicular to the first direction in a region adjacent to the floating diffusion region FD and in the third direction (e.g., the Y-direction), perpendicular to the first direction and the second direction. For example, the region between separated device isolation films DTI may be formed, one by one, in each of the first subpixel groups SPG1.

The device isolation layer DTI may allow electrical charges generated in the photodiodes PD respectively included in the plurality of unit pixels PX to be accumulated in the corresponding photodiodes PD. In the image sensor 100 according to an example embodiment, the device isolation layer DTI defining the plurality of unit pixels PX included in the first pixel group PG1 may be formed so that electrical charges generated by the photodiodes PD included in the first pixel group GP1 do not overflow to the photodiodes PD included in other pixels.

In the first pixel group PG1 of the image sensor 100 according to an example embodiment, the floating diffusion region FD included in the first subpixel group SPG1 may be shared between the plurality of unit pixels PX included in the first subpixel group SPG1. The device isolation layer DTI may be separated to an extent that overflow does not occur between the plurality of unit pixels PX sharing the floating diffusion region FD.

Figure 7:
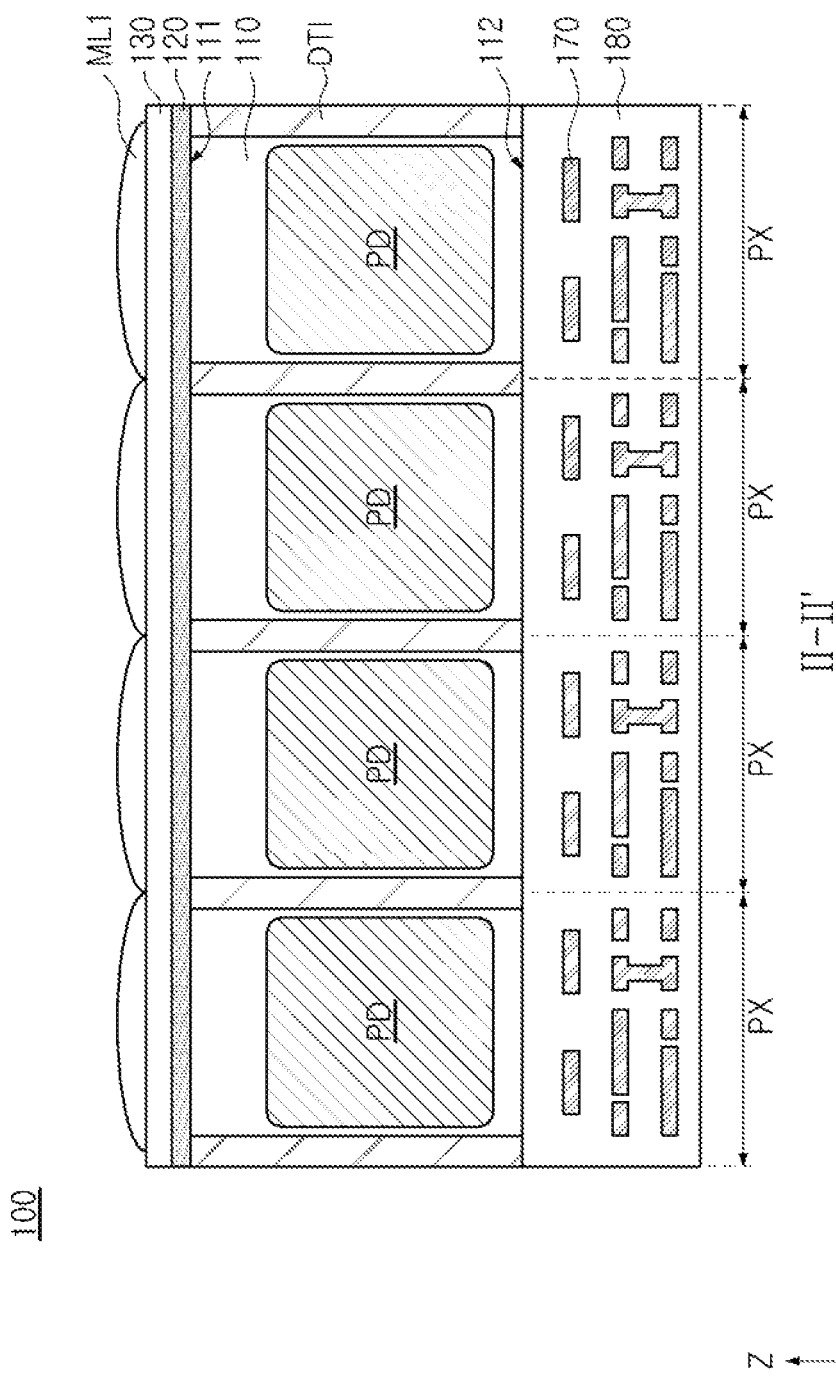
FIGS. 7 to 9 are cross-sectional views illustrating the first pixel group included in an image sensor according to an example embodiment.
Figure 8:
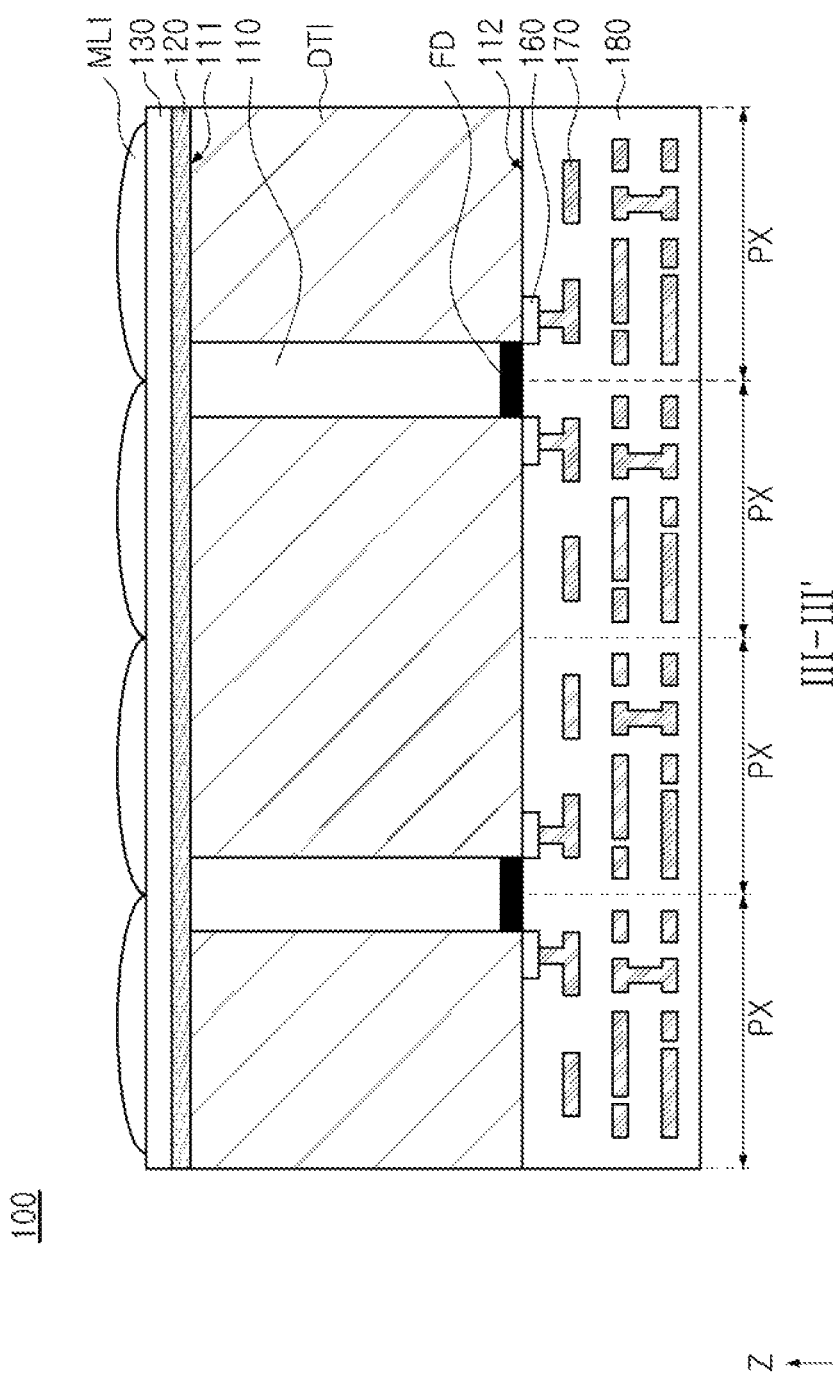
Figure 9:
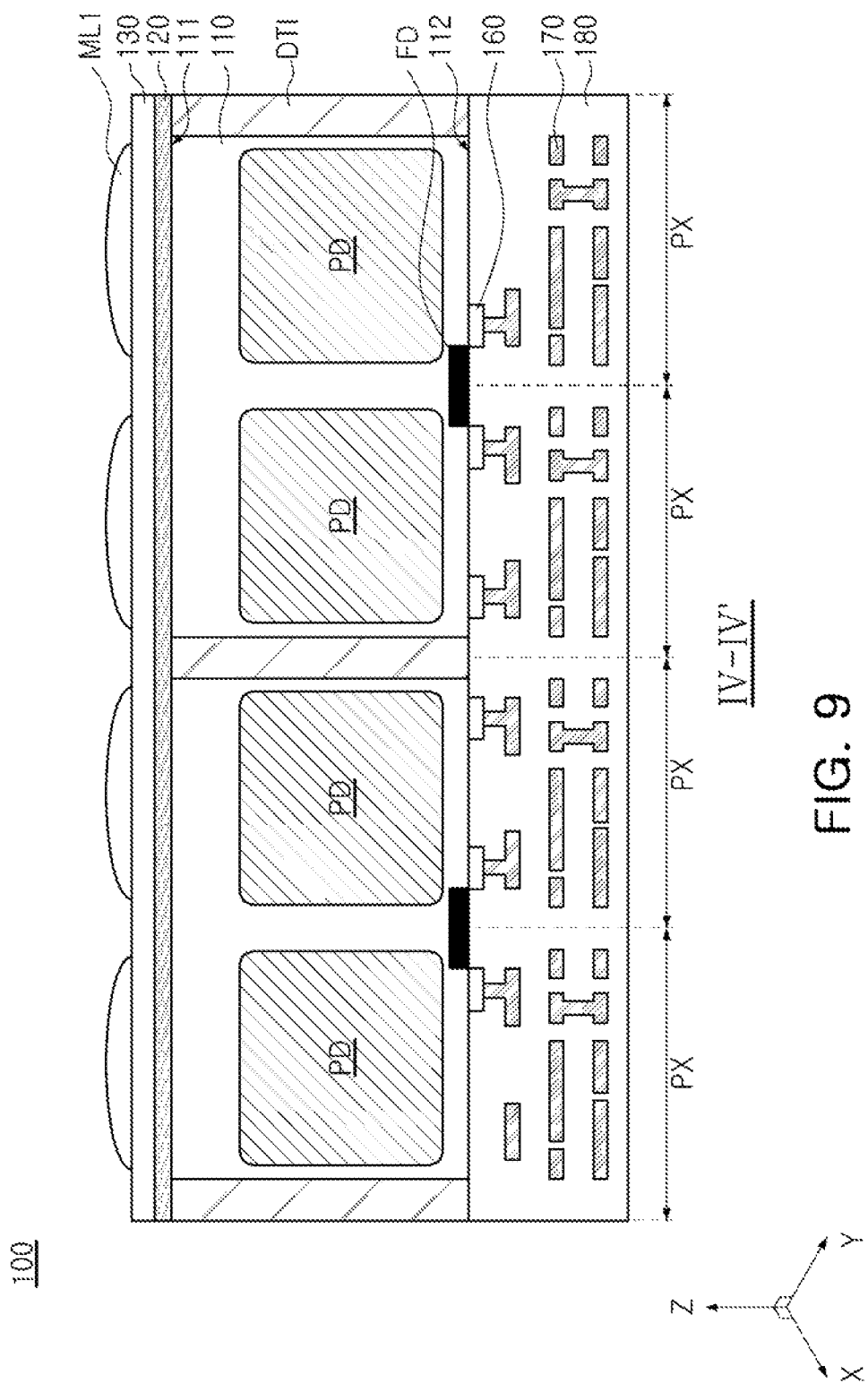

FIGS. 7 to 9 are cross-sectional views illustrating a first pixel group included in an image sensor according to an example embodiment.

FIGS. 7 to 9 are cross-sectional views of the image sensor 100 illustrated in FIG. 6 taken along lines II-II', III-III' and IV-IV', respectively. As an example, FIG. 7 is a cross-sectional view illustrating a cross-section in the direction II-II' of FIG. 6, FIG. 8 is a cross-sectional view illustrating a cross-section taken along line III-III' of FIG. 6, and FIG. 9 is a cross-sectional view illustrating a cross-section taken along line IV-IV'.

Referring to FIGS. 7 to 9, the image sensor 100 according to an example embodiment may include a substrate 110 including a first surface 111 and a second surface 112 facing each other, and a device isolation layer DTI disposed between a plurality of unit pixels PX in the substrate 110. For example, the plurality of unit pixels PX may be arranged in a direction, parallel to the first surface 111 of the substrate 110. The plurality of unit pixels PX may include photodiodes PD disposed inside the substrate 110, respectively.

In the first pixel group PG1 included in the image sensor 100 according to an example embodiment, a color filter 120, a light transmitting layer 130, and a first microlens ML1 may be sequentially disposed on the first surface 111 of the substrate 110 in the first pixel group PG1. For example, in the first pixel group PG1, the color filter 12 may be green, and the first microlens ML1 may correspond to each of the plurality of unit pixels PX. However, this is an example and example embodiments are not limited thereto.

Light that passes through the first microlens ML1 may be incident on a photodiode included in an individual one of the plurality of unit pixels PX. As described above, the first pixel group PG1 of the image sensor 100 according to an example embodiment may improve resolution of a generated image using the plurality of unit pixels PX sharing the floating diffusion region FD and the first microlenses ML1 respectively corresponding to the plurality of unit pixels ML1.

In the image sensor 100 according to an example embodiment, a pixel circuit may be disposed below the photodiode PD. For example, the pixel circuit may include a plurality of elements 160, wiring patterns 170 connected to the plurality of elements 160, and an insulating layer 180 covering the plurality of elements 160 and the wiring patterns 170, and may be disposed on the second surface 112 of the substrate 110. The pixel circuit may operate to acquire a pixel signal from the plurality of unit pixels PX.

The pixel circuit may include a floating diffusion region FD. For example, the plurality of unit pixels PX included in the first subpixel group may share the floating diffusion region FD disposed therebetween. However, the floating diffusion region FD is not limited to those illustrated in FIGS. 8 and 9. For example, a position and area of the floating diffusion region FD may be modified to vary according to example embodiments.

The plurality of elements 160 adjacent to the floating diffusion region FD may be first to fourth transfer transistors. A gate of each of the first to fourth transfer transistors may have a vertical structure in which at least a partial region is embedded in the substrate 110.

As illustrated in FIG. 7, the plurality of unit pixels PX included in the first pixel group PG1 of the image sensor 100 according to an example embodiment may be separated from each other by the device isolation layer DTI. The device isolation layer DTI may be separated from each other in the second and third directions as illustrated in FIGS. 8 and 9, and the floating diffusion region FD may be disposed in the region between separated device isolation layers DTI. The device isolation layer DTI may be separated to such an extent that an overflow of electrical charges does not occur between adjacent photodiodes.

Figure 10:
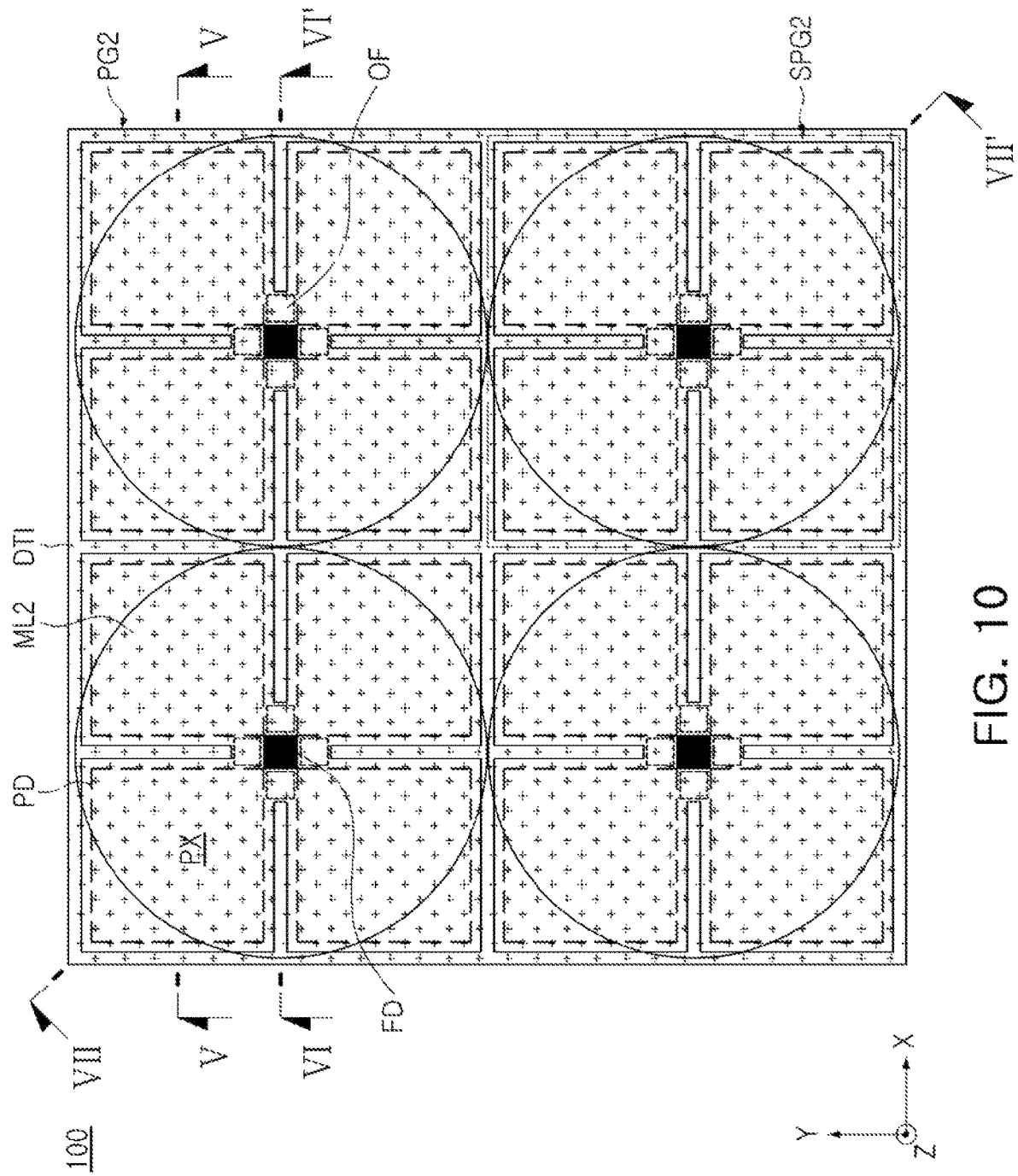
FIG. 10 is a plan view illustrating a second pixel group included in an image sensor according to an example embodiment.

FIG. 10 is a plan view illustrating a second pixel group included in an image sensor according to an example embodiment.

Referring to FIG. 10, in the image sensor 100 according to an example embodiment, the second pixel group PG2 may include a plurality of second subpixel groups SPG2 including a plurality of unit pixels PX sharing the floating diffusion region FD and arranged in a 2×2 form. For example, each of the plurality of second subpixel groups SPG2 may include a plurality of unit pixels PX arranged in a 2×2 form.

The second pixel group PG2 may include a color filter having a predetermined color. For example, the color filter included in the second pixel group PG2 may be red or blue. However, this is only an example, and example embodiments are not limited thereto, and the color of the color filter may vary.

Each of the plurality of unit pixels PX may include a photodiode PD which generates an electrical signal by receiving external light. The second subpixel group SPG2 may include a second microlens ML2 shared by the plurality of unit pixels PX included in the second subpixel group PSG2. For example, the center of the second microlens ML2 may overlap the floating diffusion region FD in the first direction (e.g., the Z direction).

Because the second microlens ML2 is shared by the plurality of unit pixels PX arranged in a 2×2 form included in one second subpixel group SPG2, the plurality of unit pixels PX included in the second pixel group PG2 may include an autofocusing pixel. The plurality of unit pixels PX may perform an autofocusing in the second direction (e.g., the X-direction), perpendicular to the first direction, and in the third direction (e.g., the Y-direction), perpendicular to the first and second directions. For example, the unit pixels PX arranged side by side in the second direction may perform an autofocusing using a phase difference in the left and right directions of incident light, and the unit pixels PX arranged side by side in the third direction may perform the autofocusing using a phase difference in an up-down direction of incident light.

Like the first pixel group PG1 illustrated in FIG. 6, the plurality of unit pixels PX may be defined by the device isolation layer DTI extending in the first direction. The device isolation layer DTI may be separated from each other in a region adjacent to the floating diffusion region FD. For example, a region between separated device isolation layers DTI may be formed in each of the second subpixel groups SPG2. However, a length of the region between the separated device isolation layers DTI in the second direction and/or in the third direction in the second pixel group PG2, may be greater than a length of the region between the separated device isolation layers DTI in the second direction and/or in the third direction in the first pixel group PG1.

The device isolation layer DTI may allow electrical charges generated in the photodiodes PD respectively included in the plurality of unit pixels PX to be accumulated in the corresponding photodiodes PD. In the image sensor 100 according to an example embodiment, the device isolation layer DTI defining the plurality of unit pixels PX included in the second pixel group PG2 may include an overflow region OF in which generated electrical charges overflow to the photodiode PD included in an adjacent pixel when the photodiode PD included in each of the plurality of unit pixels is saturated.

According to an example embodiment, the floating diffusion region FD included in the second subpixel group SPG2 may be shared between the plurality of unit pixels PX included in the second subpixel group SPG2. The device isolation layer DTI may be separated between the plurality of unit pixels PX sharing the floating diffusion region FD to form the overflow region OF.

In the image sensor 100 according to an example embodiment, the overflow region OF included in the second pixel group PG2 may prevent saturation of the photodiode PD due to electrical charges generated in excess of capacitance of each of the plurality of unit pixels PX. Therefore, a maximum amount of electrical charges that may be generated and accumulated in each of the plurality of unit pixels PX included in the second pixel group PG2 may be greater than a maximum amount of electrical charges that may be generated and accumulated in each of the plurality of unit pixels PX included in the first pixel group PG1.

Figure 11:
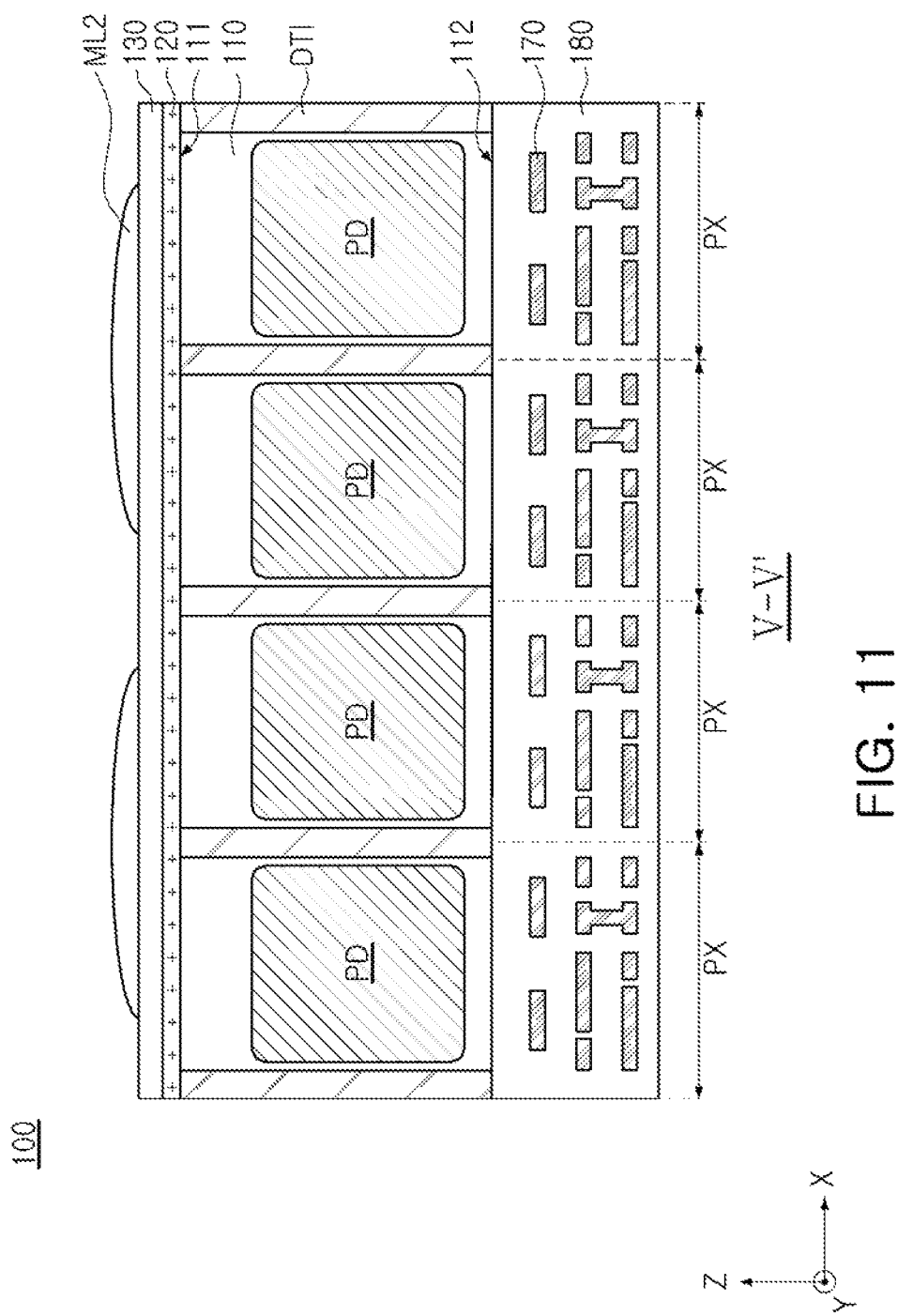
FIGS. 11 to 13 are cross-sectional views illustrating the second pixel group included in an image sensor according to an example embodiment.
Figure 12:
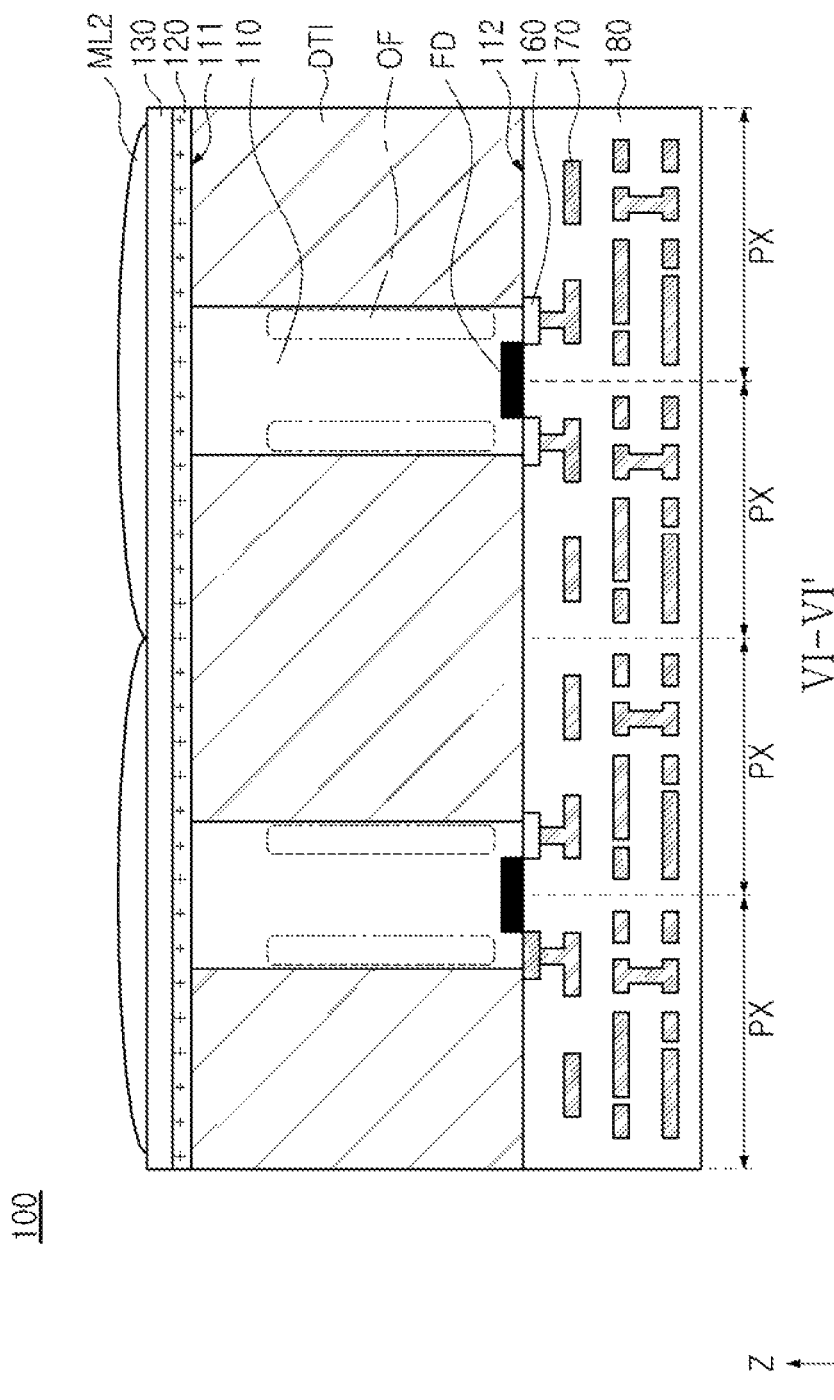
Figure 13:
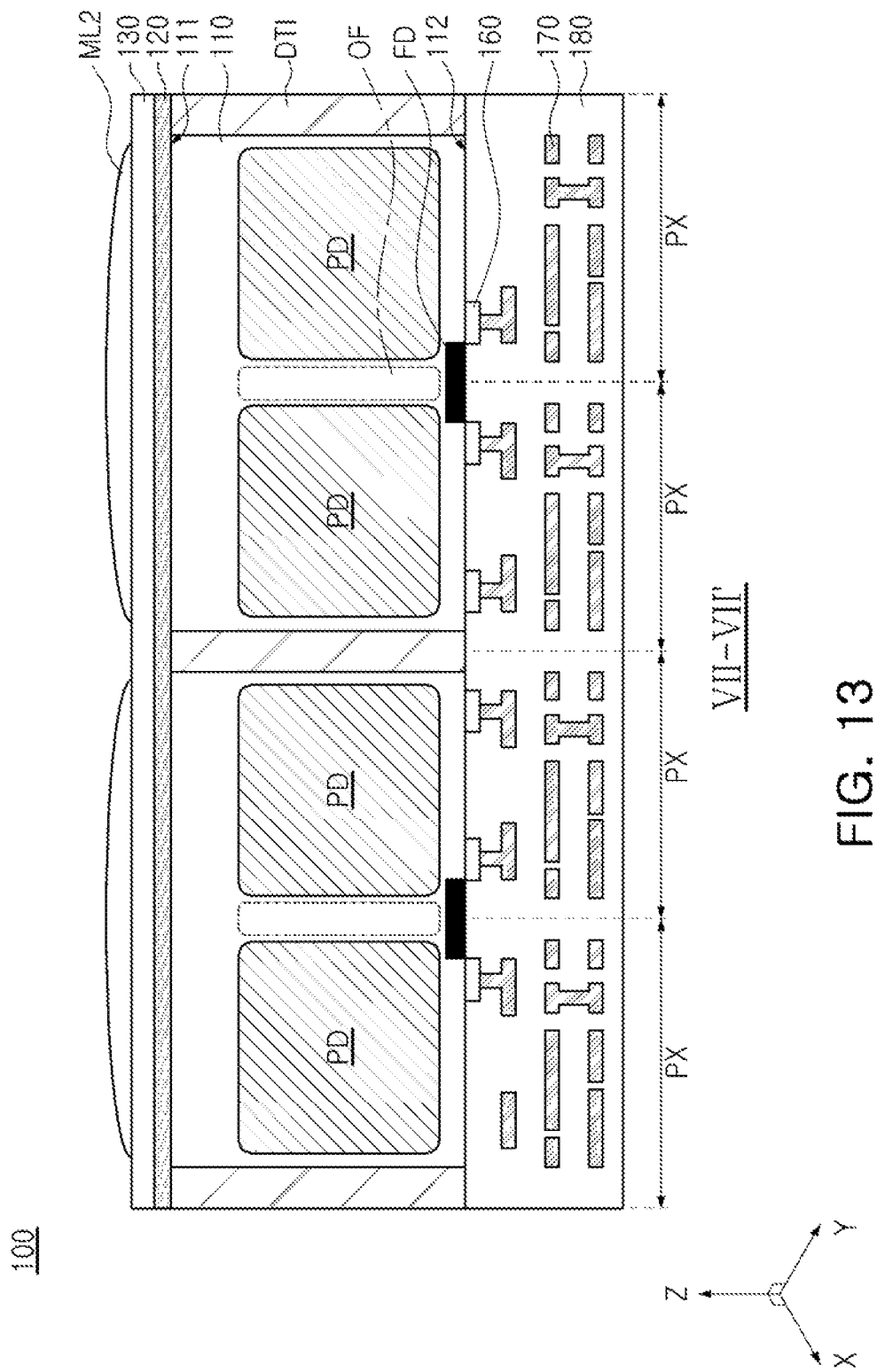

FIGS. 11, 12, and 13 are cross-sectional views illustrating a second pixel group included in an image sensor according to an example embodiment.

FIGS. 11, 12, and 13 are cross-sectional views of the image sensor 100 illustrated in FIG. 10 taken along lines V-V', VI-VI' and VII-VII', respectively. As an example, FIG. 11 is a cross-sectional view illustrating a cross-section taken along line V-V' of FIG. 10, FIG. 12 is a cross-sectional view taken along line VI-VI' of FIG. 10, and FIG. 13 is a cross-sectional view taken along line VII-VII' of FIG. 10.

FIGS. 11, 12, and 13 may correspond to FIGS. 7 to 9, respectively. For example, the components of the image sensor 100 illustrated in FIGS. 11 to 13 may correspond to the components of the image sensor 100 illustrated in FIGS. 7 to 9. However, the second pixel group PG2 illustrated in FIGS. 11 to 13 may be different from the first pixel group PG1 illustrated in FIGS. 7 to 9 in relation to the second microlens ML2, a color of the color filter 120, a shape of the device isolation layer DTI, and the overflow region OF.

In the second pixel group PG2 included in the image sensor 100 according to an example embodiment, the color filter 120, the light transmitting layer 130, and the second microlens ML2 may be sequentially disposed on the first surface 111 of the substrate 110. For example, in the second pixel group PG2, the color filter 120 may be red or blue, and the second microlens ML2 may be shared by a plurality of unit pixels included in the second subpixel group SPG2. However, this is an example and example embodiments are not limited thereto.

Light that passes through an individual one of the second microlenses ML2 may be incident on the photodiodes of the plurality of unit pixels PX included in the second subpixel group SPG2 corresponding to the individual second microlens ML2. As described above, in the second pixel group PG2 of the image sensor 100 according to an example embodiment, optical loss during image generation may be reduced and autofocusing may be performed in four directions using the plurality of unit pixels PX sharing the floating diffusion region FD and the second microlens ML2 shared by the plurality of unit pixels PX.

As illustrated in FIG. 10, the plurality of unit pixels PX included in the second pixel group PG2 of the image sensor 100 according to an example embodiment may be separated from each other by the device isolation layer DTI. The device isolation layers DTI may be separated from each other in the second and third directions as illustrated in FIGS. 12 and 13, and the floating diffusion region FD may be disposed in the region between separated device isolation layers DTI. The overflow region OF may be disposed in the region between the separated device isolation layers DTI, i.e., between the floating diffusion region FD and the device isolation layer DTI. Through the overflow region OF, before any one photodiode PD is saturated, electrical charges generated in the corresponding photodiode PD may move to an adjacent photodiode.

FIGS. 14A, 14B, 15A, 15B, 16A, 16B and 17 are diagrams illustrating a process of manufacturing an image sensor according to an example embodiment.

FIGS. 14A, 14B, 15A, 15B, 16A, 16B and 17 may be views illustrating a process of manufacturing the image sensor 100 according to an example embodiment illustrated in FIGS. 5 to 13. FIGS. 14A, 15A, 16A, and 17 are cross-sectional views taken along line I-I' of FIG. 6, and FIGS. 14B, 15B, and 16B are top views of the image sensor 100 according to the process.

Figure 14A:
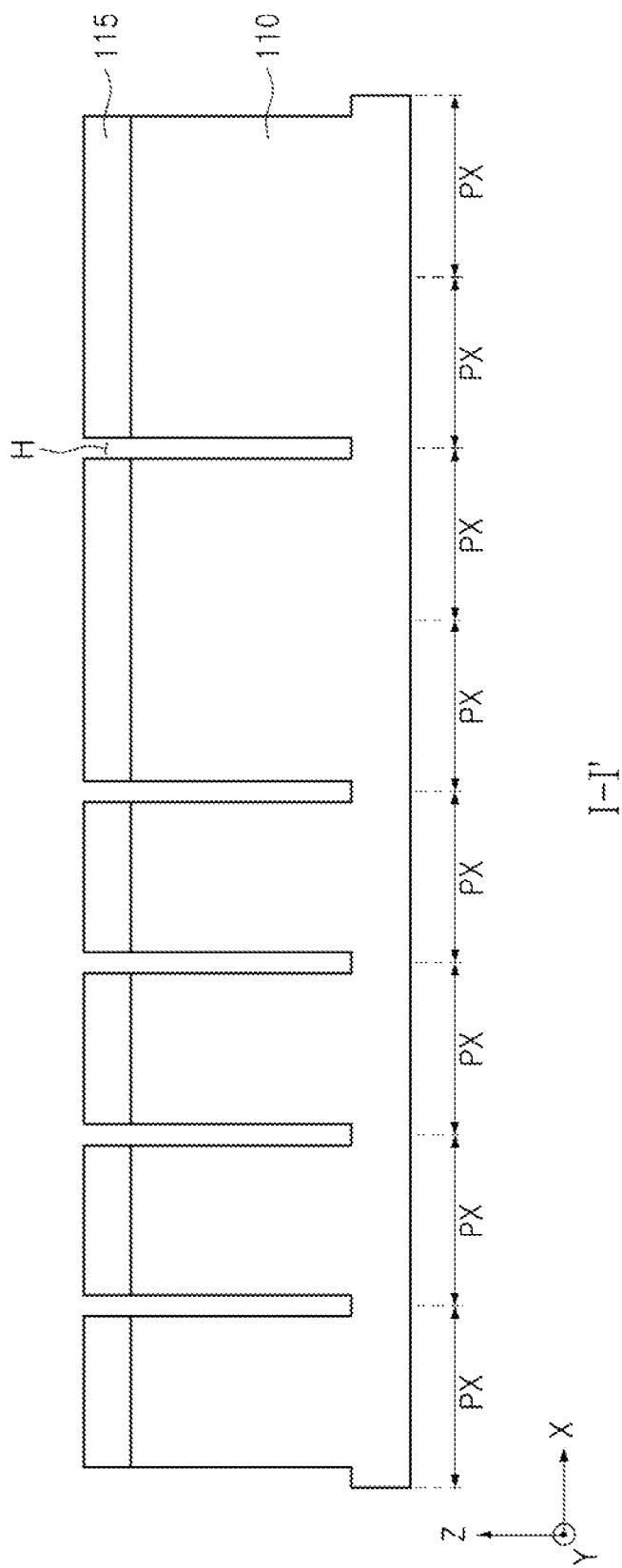
FIGS. 14A, 14B, 15A, 15B, 16A, 16B and 17 are views illustrating a process of manufacturing an image sensor according to an example embodiment.
Figure 14B:
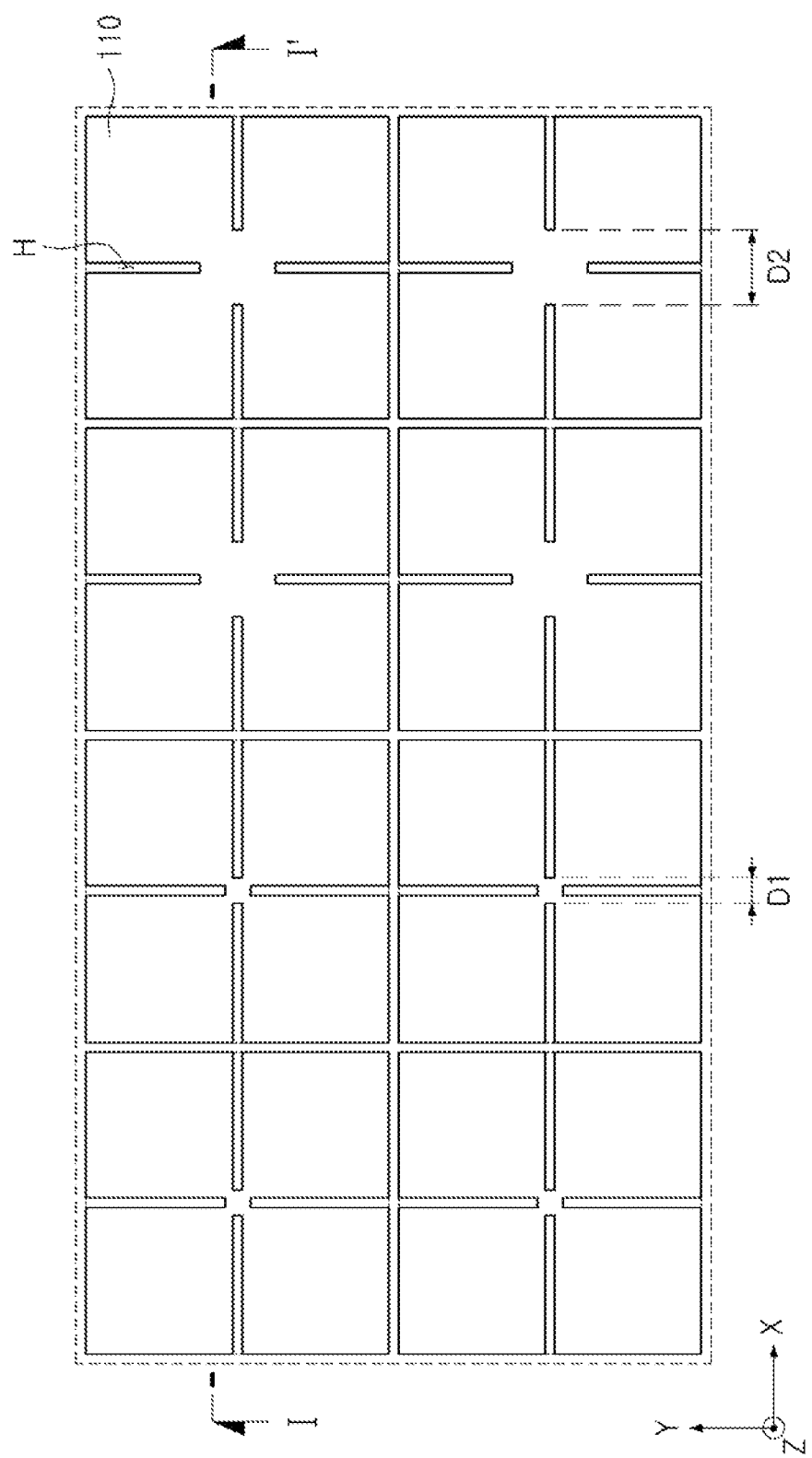

Referring to FIGS. 14A and 14B, a process for manufacturing the image sensor 100 according to an example embodiment may include forming a trench H extending in the first direction (e.g., the Z-direction) in the substrate 110 to separate pixel regions in which a plurality of unit pixels PX are to be formed before the device isolation layer is formed.

In the image sensor 100 according to an example embodiment, a mask layer 115 may be formed on an upper surface of the substrate 110 before the trench H is formed. For example, the mask layer 115 may be a layer for protecting the substrate 110 so that the substrate 110 is not etched other than a region in which the trench H is to be formed during an etching process for forming the trench H.

The trench H may be formed by an etching process performed after the mask layer 115 is formed. However, a shape of the trench H illustrated in FIGS. 14A and 14B is not limited, and the shape of the trench H may be modified to vary according to example embodiments.

The device isolation layer included in the image sensor 100 according to an example embodiment may be formed by a front deep trench isolation (FDTI) process. Accordingly, the trench H for forming the device isolation layer may be formed in a direction from the second surface of the substrate 110 on which the pixel circuit is to be disposed to the first surface of the substrate 110 on which the microlens is to be disposed. However, this is an example, and example embodiments are not limited thereto.

In the image sensor 100 according to an example embodiment, device isolation layers formed in the first pixel group may be different from device isolation layers formed in the second pixel group. For example, the device isolation layers may be separated from each other in a region in which a floating diffusion region is to be formed. Accordingly, the trench H formed through an etching process to form the device isolation layer may not completely penetrate through the substrate 110, and may be formed in the region in which the first pixel group is to be formed, and the trench H formed in a region in which the first pixel group is to be formed may be different from the trench H formed in a region in which the second pixel group is to be formed in the second direction (e.g., the X-direction) and the third direction (e.g., the Y-direction).

Referring to FIG. 14B, the trench H for forming the device isolation layer included in the region in which the first pixel group is to be formed may be separated by a length of D1 in the second and third directions. The trench H for forming the device isolation layer included in the region in which the second pixel group is to be formed may be separated by a length D2 in the second and third directions. For example, D1 may be smaller than D2. The illustrated cross-section in the I-I' direction may pass through the trench H included in the region in which the first pixel group is to be formed and may not pass through the trench H included in the region in which the second pixel group will be formed.

Figure 15A:
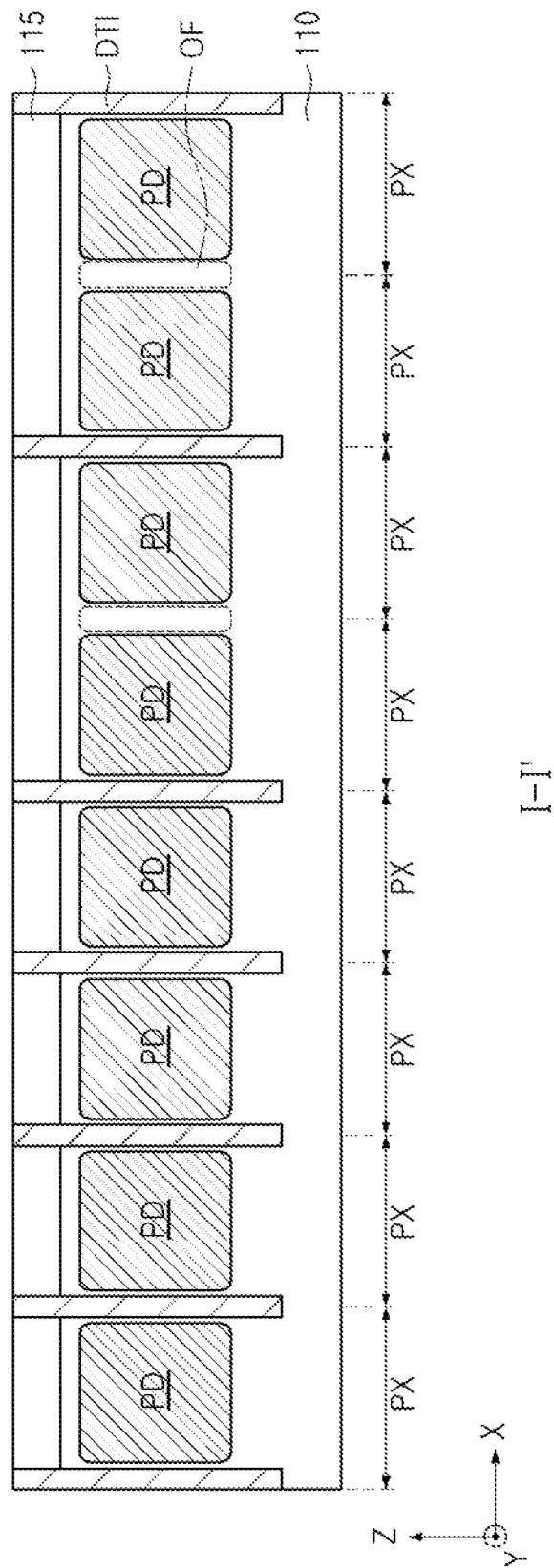
Figure 15B:
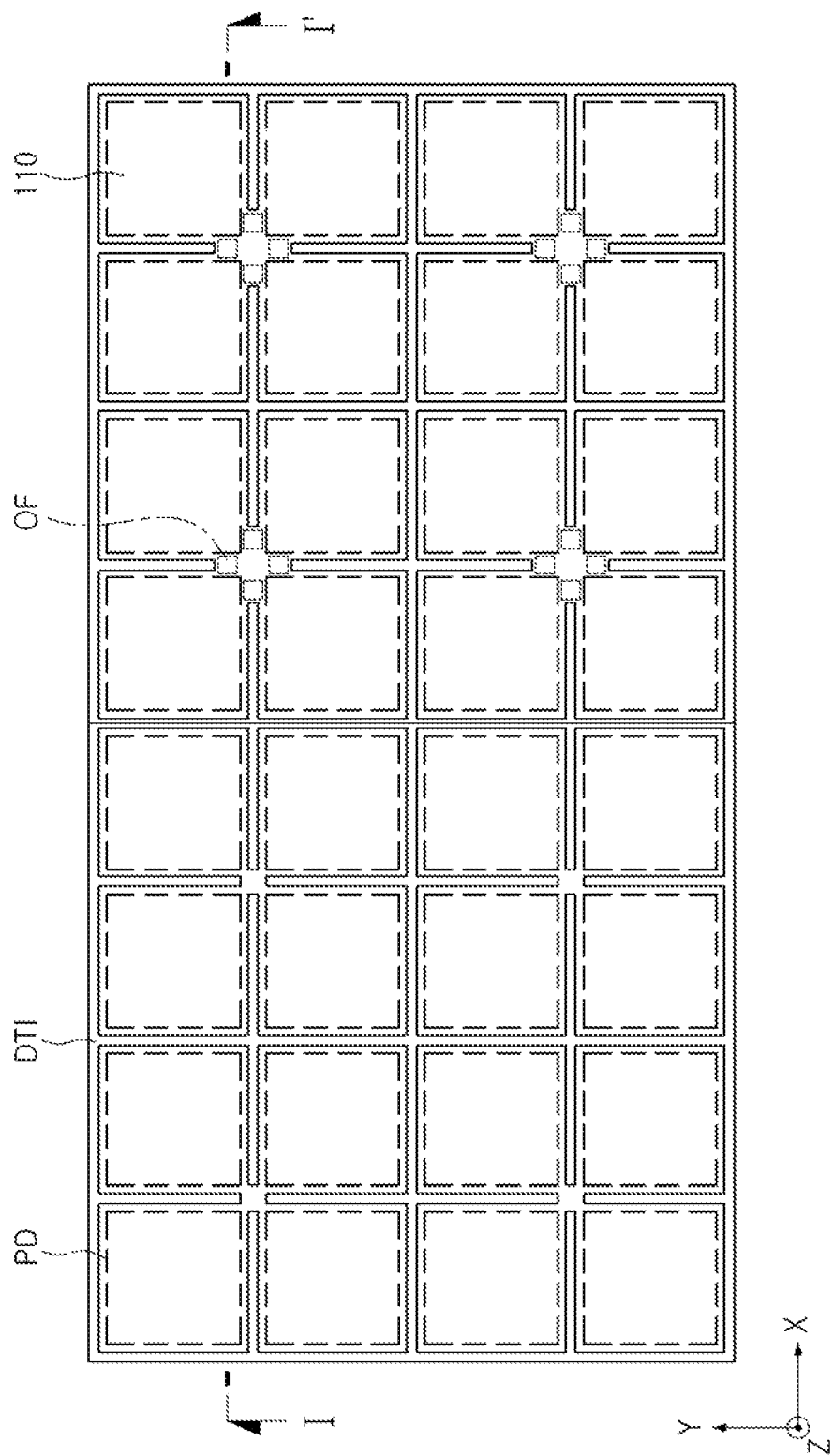

Referring to FIGS. 15A and 15B, the process for manufacturing the image sensor 100 according to an example embodiment may include implanting impurities into the substrate 110 through the trench H and forming a device isolation layer DTI. For example, the impurities implanted into the substrate 110 through the trench H may diffuse, and a photodiode PD may be formed.

Because the depths of the trench H formed in the region in which the first pixel group is to be formed and in the region in which the second pixel group is to be formed are different, a shape of the device isolation layer DTI formed in the trench H may also be changed. For example, in the region in which the second pixel group is to be formed, an overflow region OF to which electrical charges may move may be formed between the photodiodes PD.

Figure 16A:
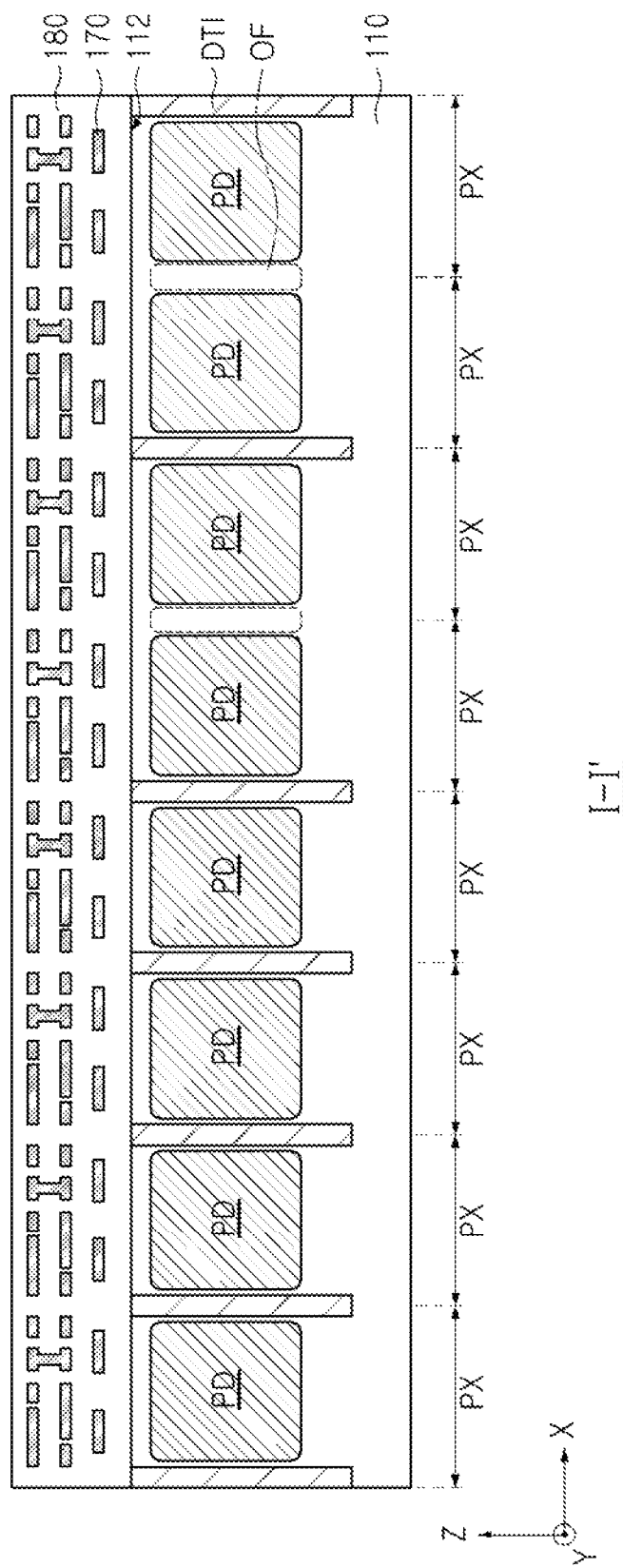
Figure 16B:
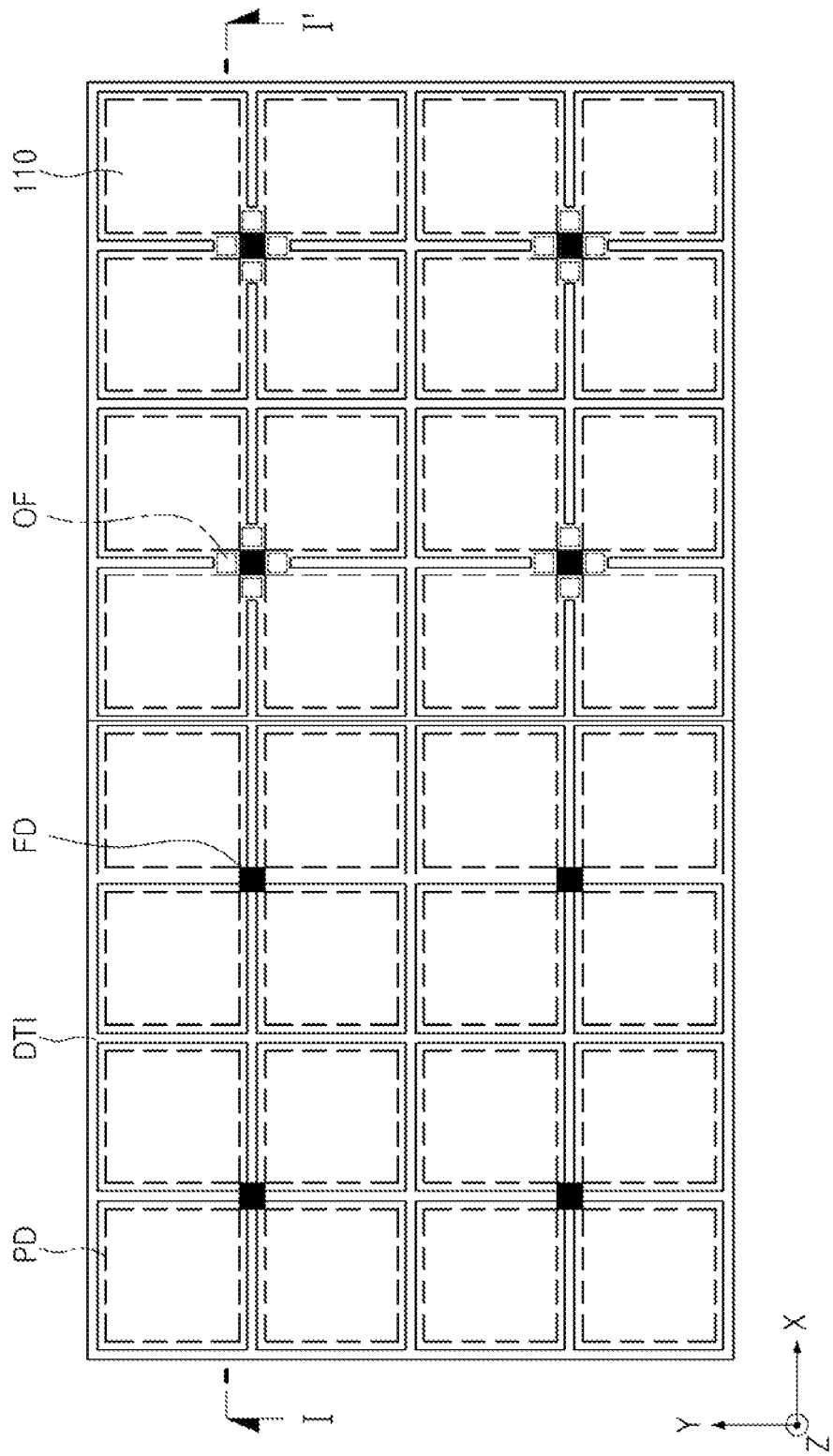

Referring to FIGS. 16A and 16B, the process of manufacturing the image sensor 100 according to an example embodiment may include forming the second surface 112 of the substrate 110 and disposing a pixel circuit on the second surface 112. As described above, the pixel circuit may include a plurality of elements 160, wiring patterns 170 connected to the plurality of elements, and an insulating layer 180 covering the plurality of elements and the wiring patterns. For example, the plurality of elements may include a floating diffusion region FD.

After the device isolation layer DTI is formed, the mask layer 115 which was formed to perform the previous processes, a portion of the substrate 110, and a portion of the device isolation layer DTI may be removed by a polishing process, etc. An upper surface of the substrate 110 removed by the polishing process or the like may be the second surface 112. For example, a pixel circuit may be disposed on the second surface 112 of the substrate 110.

Figure 17:
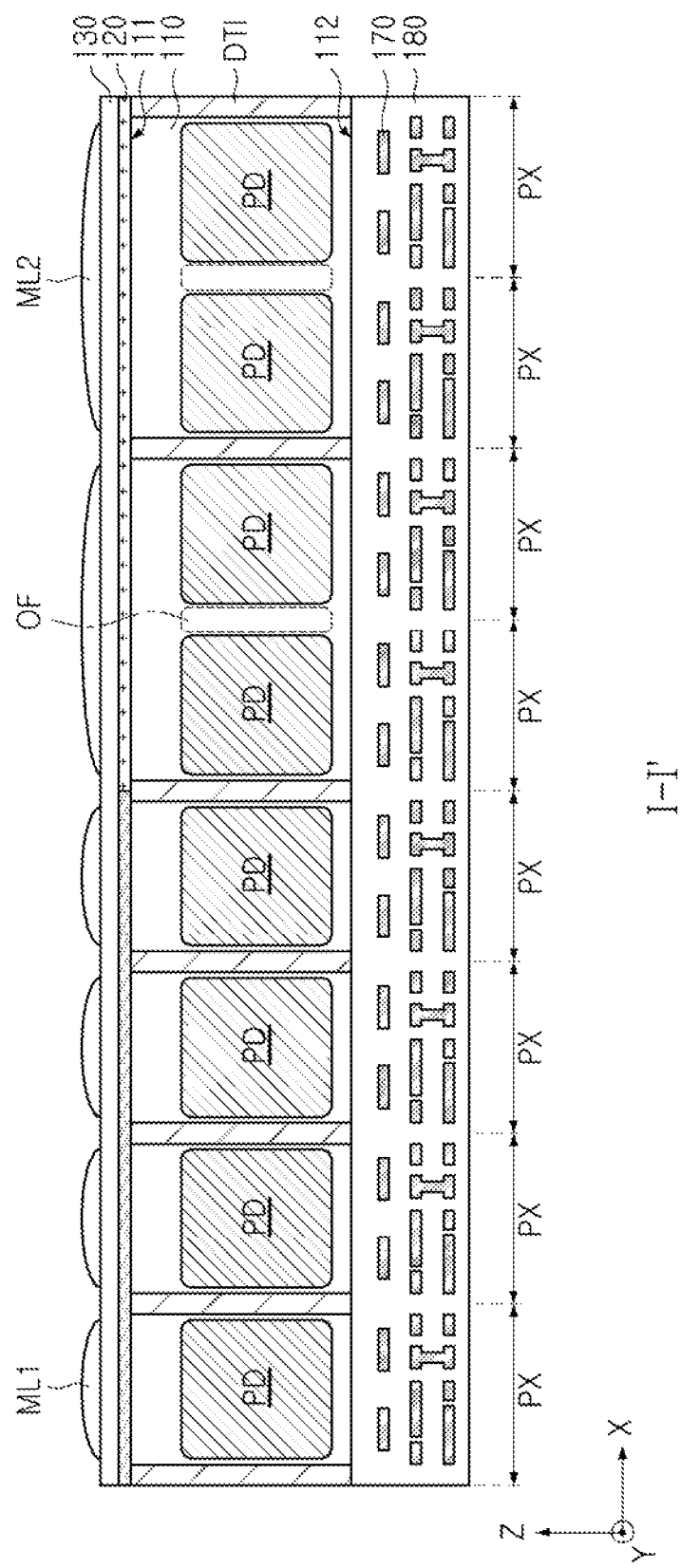

Referring to FIG. 17, a process of manufacturing the image sensor 100 according to an example embodiment may include a process of removing a partial region of the substrate 110 from the opposite side of the pixel circuit through a polishing process. For example, the region removed by the polishing process may include a portion of the device isolation layer DTI, and one surface of the substrate 110 remaining after the removing may be the first surface 111.

The image sensor 100 according to an example embodiment may include the color filter 120, the light transmitting layer 130, and the first and second microlenses ML1 and ML2 sequentially disposed on the first surface 111 of the substrate 110. From this, the image sensor 100 illustrated in FIGS. 5 and 17 may be manufactured. However, this is only an example, and a structure of the manufactured image sensor 100 is not limited to that illustrated in FIG. 17.

Figure 18:
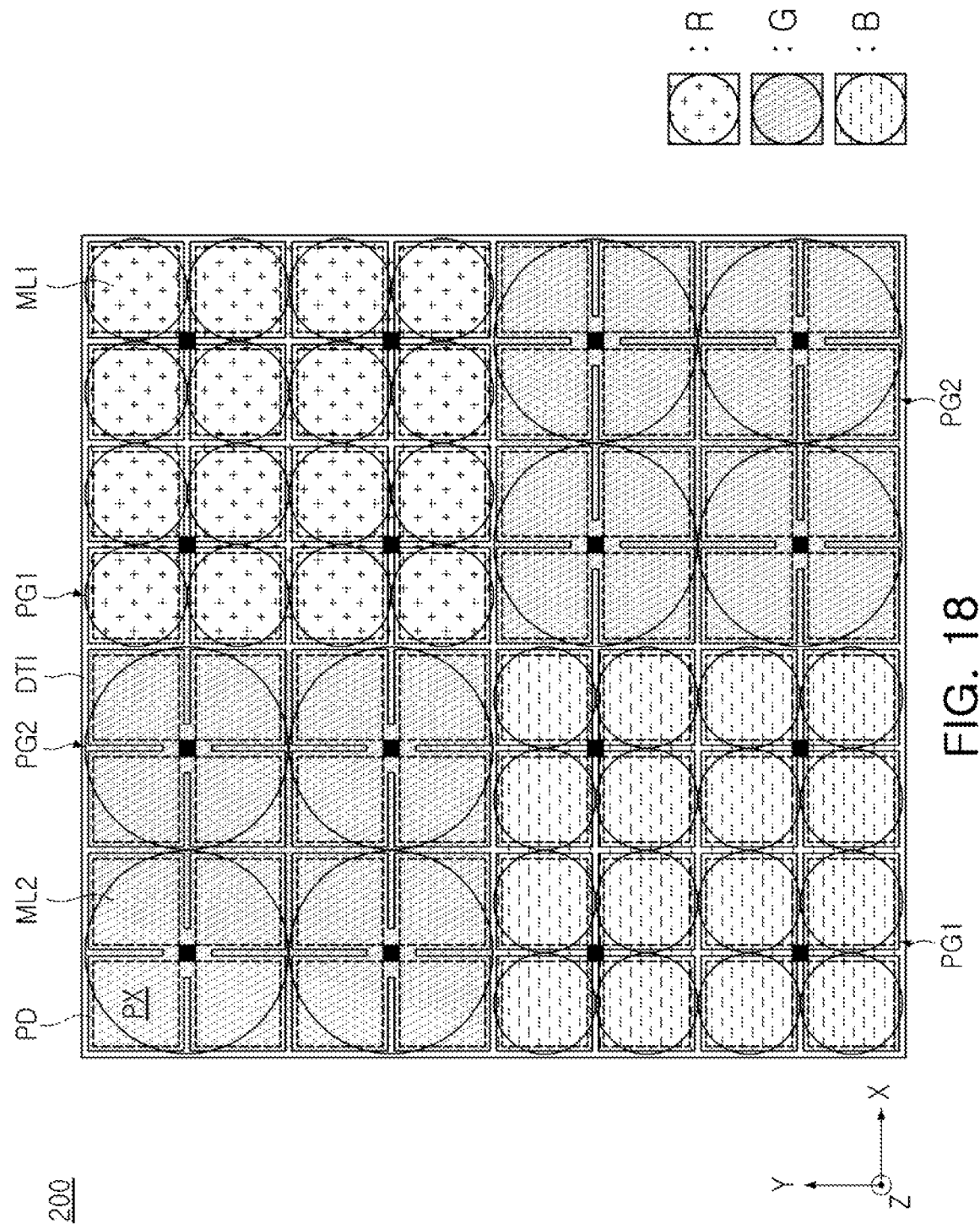
FIGS. 18 to 20 are plan views illustrating pixel groups included in an image sensor according to another example embodiment.
Figure 19:
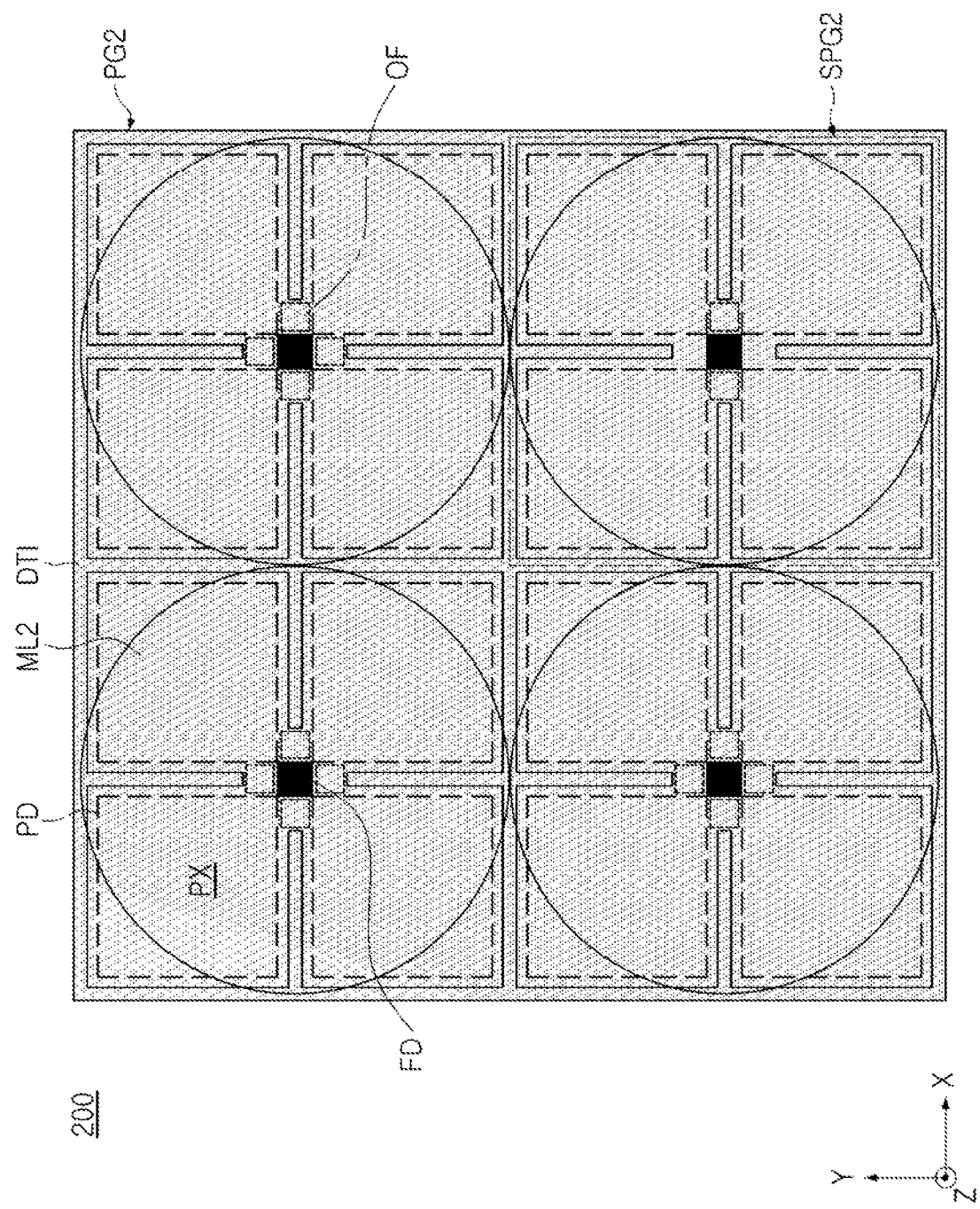
Figure 20:
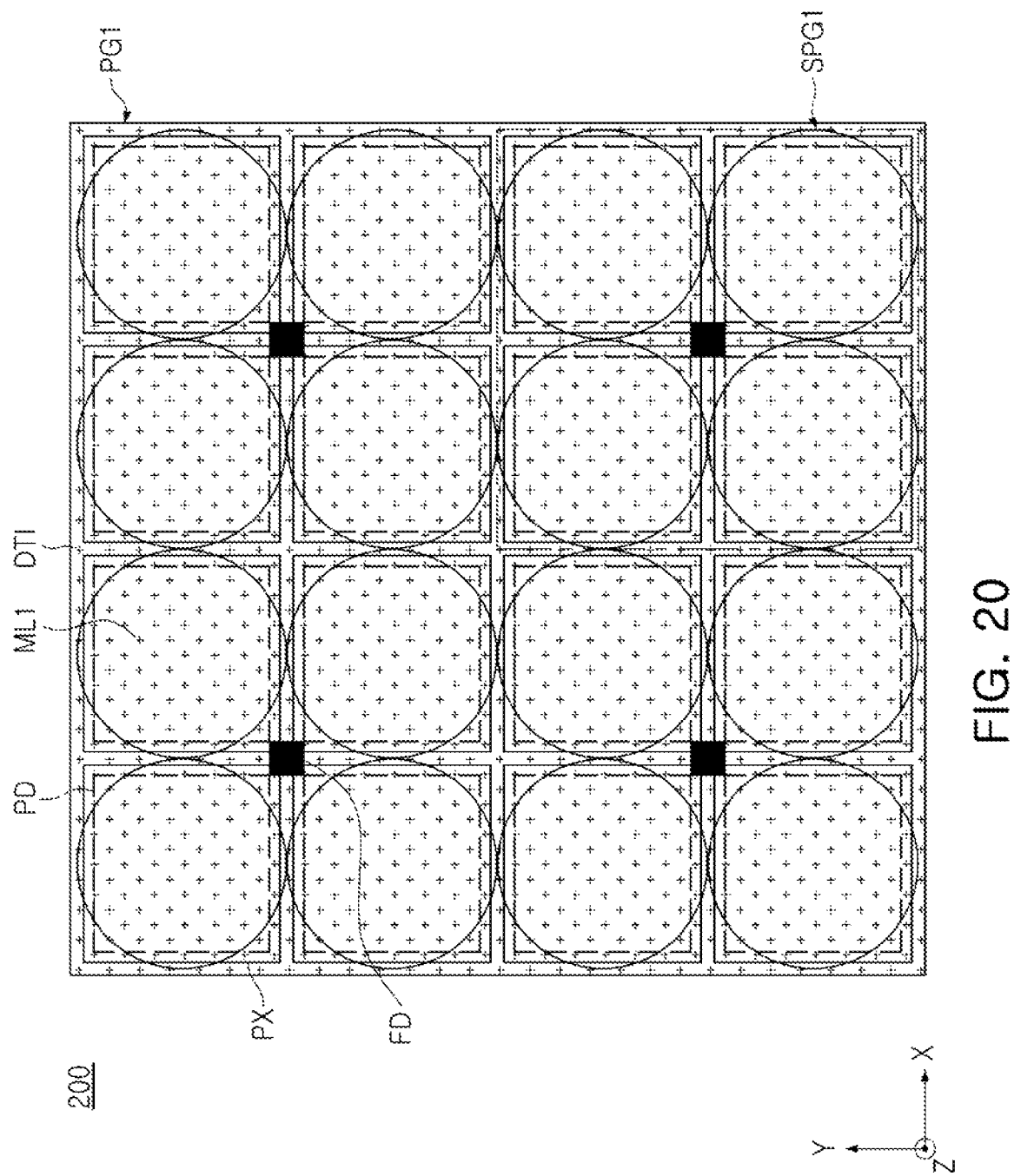

FIGS. 18 to 20 are plan views illustrating pixel groups included in an image sensor according to another example embodiment.

FIG. 18 is a diagram illustrating pixel groups PG1 and PG2 corresponding to one color filter array included in an image sensor 200 and components thereof according to another example embodiment. For example, like the image sensor 100 illustrated in FIG. 5, one color filter array may correspond to four pixel groups PG1 and PG2, and in the first direction (e.g., the Z direction), the pixel groups PG1 and PG2 may include a color filter having a predetermined color in the first direction (e.g., the Z direction).

Referring to FIG. 18, one color filter array may include green, red, blue, and green color filters arranged in the same order as illustrated in FIG. 5. Also, the plurality of pixel groups PG1 and PG2 may include a plurality of first pixel groups PG1 including first microlenses ML1 respectively corresponding to the plurality of unit pixels PX and a plurality of second pixel groups PG2 including a second microlens ML2 shared by a plurality of unit pixels PX arranged in a 2×2 form.

However, unlike the image sensor 100 illustrated in FIG. 5, in the image sensor 200 illustrated in FIG. 18, a plurality of first pixel groups PG1 may include a red or blue color filter, and the plurality of second pixel groups PG2 may include a green color filter. As an example, an arrangement of components included in the image sensor 200 may be the same as that of the image sensor 100 illustrated in FIG. 5.

FIGS. 19 and 20 may be diagrams illustrating the second pixel group PG2 and the first pixel group PG1 of the image sensor 200 according to an example embodiment, respectively. As an example, FIGS. 19 and 20 may correspond to FIGS. 10 and 6, respectively. However, in the image sensor 200 illustrated in FIGS. 19 and 20, a color of a color filter may be different from the image sensor 100 illustrated in FIGS. 10 and 6.

A person may recognize brightness, intensity, and color of light entering the eye. In general, when green light is incident on the eye, a person may most sensitively recognize brightness, intensity, and color. Accordingly, the image sensor 100 illustrating in FIG. 5 allowing an image having high resolution in the unit pixels PX corresponding to a green color filter to be generated and performing autofocusing in the unit pixels PX corresponding to the red and blue color filter may correspond to an example embodiment closer to the human eye. However, this is only an example, and example embodiments are not limited thereto, and an image may be generated using the image sensor 200 illustrated in FIG. 18.

FIGS. 21 to 24 are plan views illustrating pixel arrays included in an image sensor according to example embodiments.

FIGS. 21 to 24 may be views illustrating a pixel array included in an image sensor according to other example embodiments together with the image sensors 100 and 200 illustrated in FIGS. 5 and 18.

In the pixel arrays 100A, 200A, 300A, and 400A included in the image sensor according to an example embodiment, the plurality of unit pixels PX may configure subpixel groups SPG1 and SPG2 in every 2×2 array. The plurality of subpixel groups SPG1 and SGP2 arranged in the 2×2 form may configure pixel groups PG1 and PG2.

A color filter included in the plurality of pixel groups PG1 and PG2 may have any one of red (R), green (G), and blue (B) colors. As an example, the pixel arrays 100A, 200A, 300A, and 400A of the image sensor may include color filters having a color filter array CFA repeatedly arranged in an order of green, red, blue, and green to correspond to the plurality of pixel groups PG1 and PG2 arranged in the 2×2 form. However, this is only an example embodiment, and the repeatedly configured color filter arrangement CFA may vary. For example, a white color filter may be included in the color filter array CFA.

In other words, in the pixel arrays 100A, 200A, 300A, and 400A, a color filter of the same color may be disposed for each pixel group PG1 and PG2, and each of the plurality of pixel groups PG1 and PG2 may include a plurality of unit pixels PX arranged in 4×4 form.

The plurality of pixel groups PG1 and PG2 may be divided into a first pixel group PG1 or a second pixel group PG2. The first pixel group PG1 may include the first subpixel group SPG1 and may include a first microlens ML1 disposed on the substrate. The second pixel group PG2 may include a second subpixel group SPG2 and may include a second microlens ML2 disposed on the substrate. For example, each of the plurality of pixel groups PG1 and PG2 may include only any one of the first subpixel group SPG1 or the second subpixel group SPG2.

Figure 21:
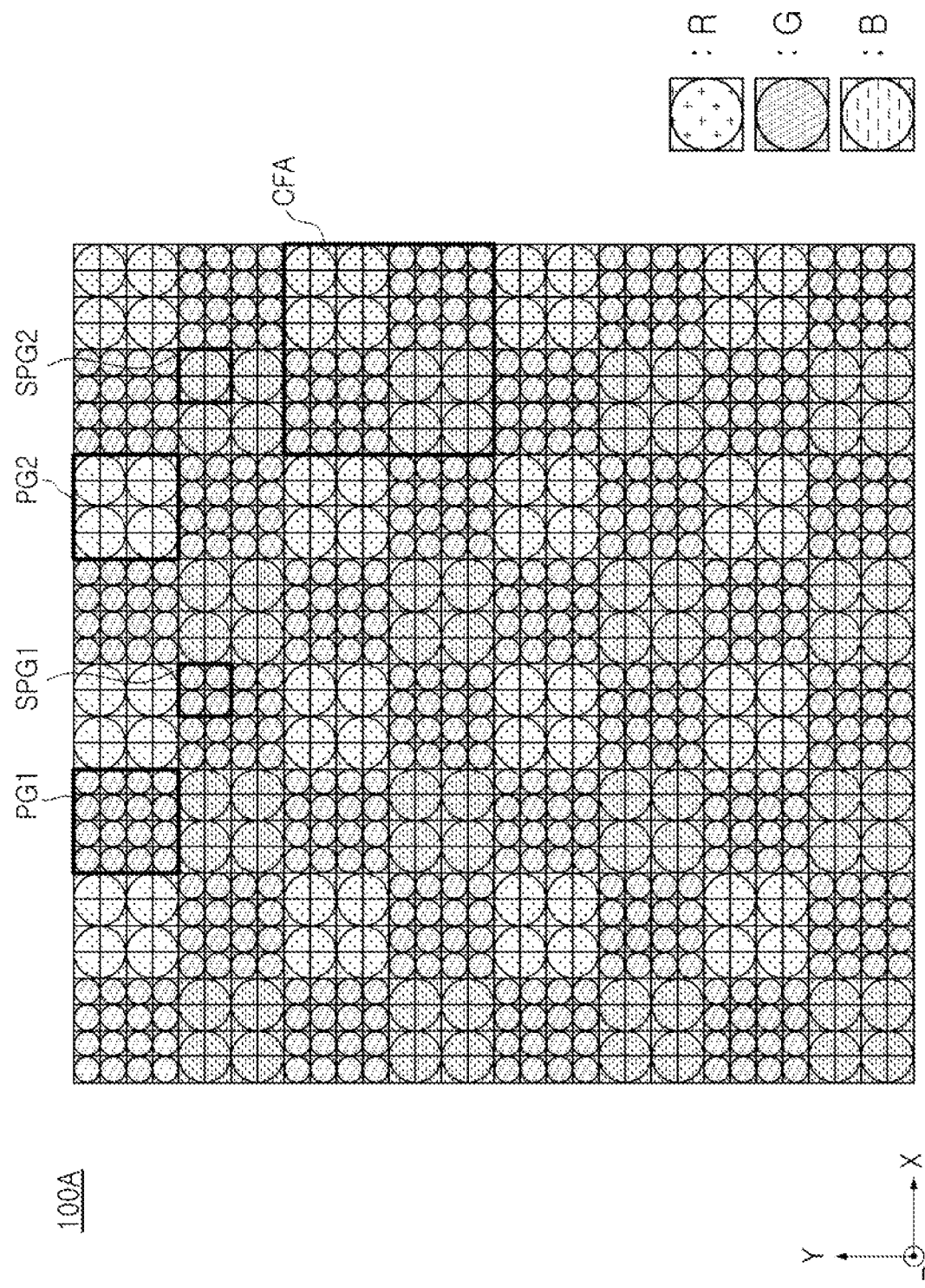
FIGS. 21 to 24 are plan views illustrating pixel arrays included in an image sensor according to example embodiments.
Figure 22:
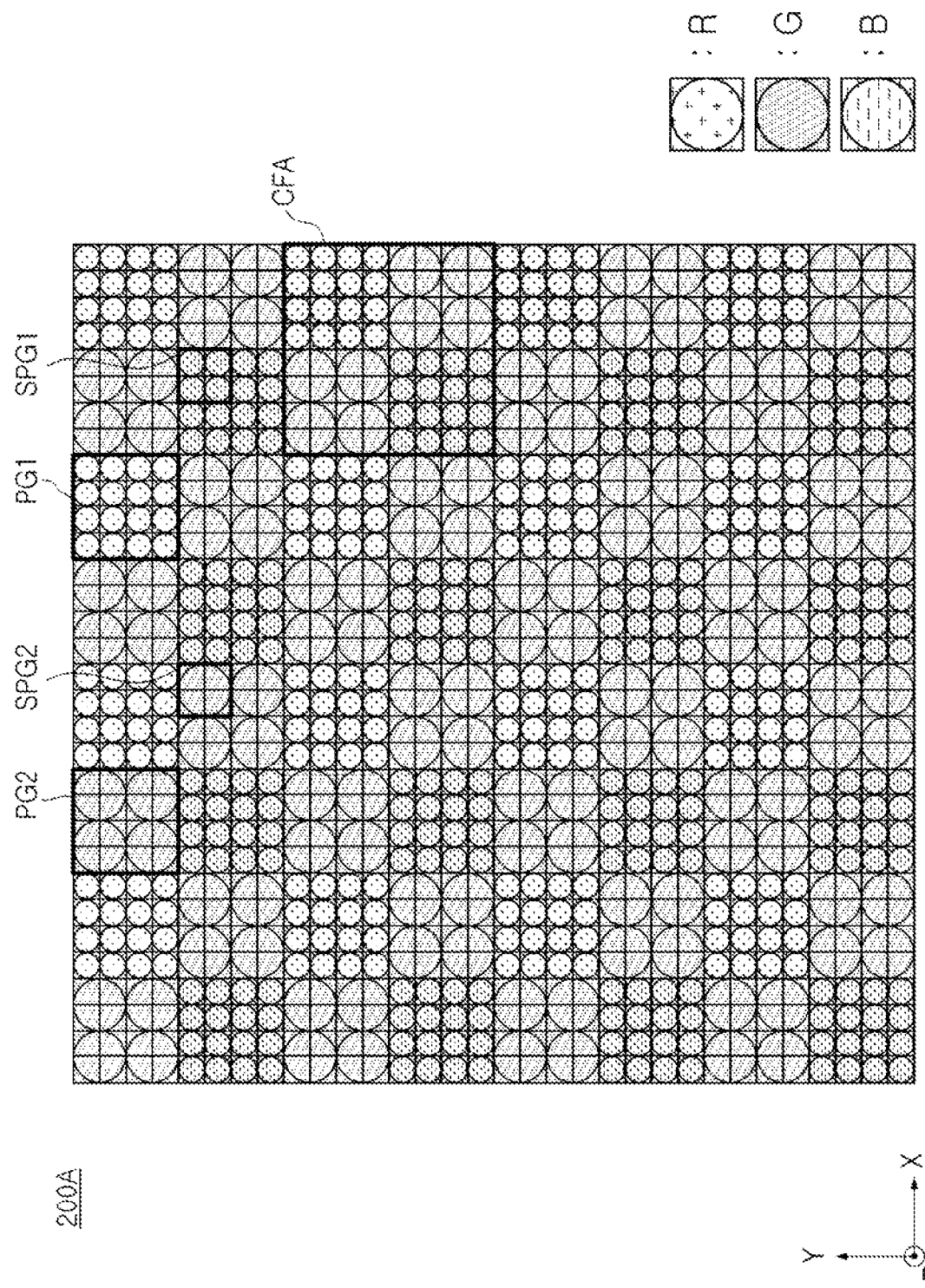

For example, the pixel array 100A illustrated in FIG. 21 may be a pixel array 100A included in the image sensor 100 illustrated in FIG. 5, and the pixel array 200A illustrated in FIG. 22 may be a pixel array 200A included in the image sensor 200 illustrated in FIG. 18.

Figure 23:
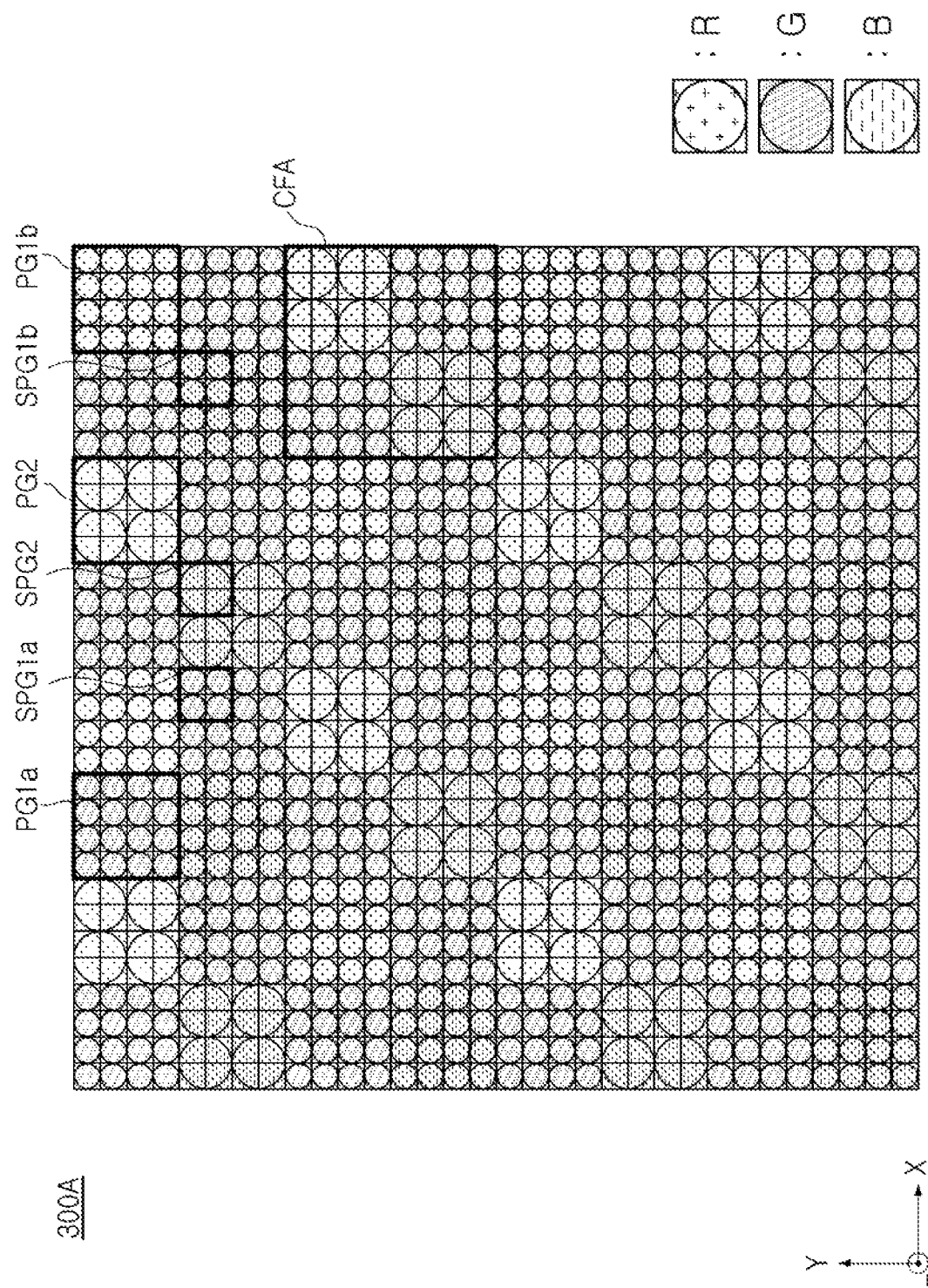

Referring to the pixel array 300A according to an example embodiment illustrated in FIG. 23, the first pixel groups PG1a and PG1b may include a color filter having any one of green, red, and blue colors.

For example, the second pixel group PG2 may include a red or blue color filter. At least one first pixel group PG1a may include a green color filter. However, at least the other first pixel group PG1b may include a red or blue color filter.

As described above, the first pixel groups PG1a and PG1b may include first subpixel groups SPG1a and SPG1b and may include a first microlens ML1 disposed on the substrate. The second pixel group PG2 may include a second subpixel group SPG2 and may include a second microlens ML2 disposed on the substrate. Accordingly, the image sensor including the pixel array 300A according to an example embodiment may generate an image having high resolution but autofocusing performance may be reduced, when compared to the image sensor 100 illustrated in FIG. 5.

Figure 24:
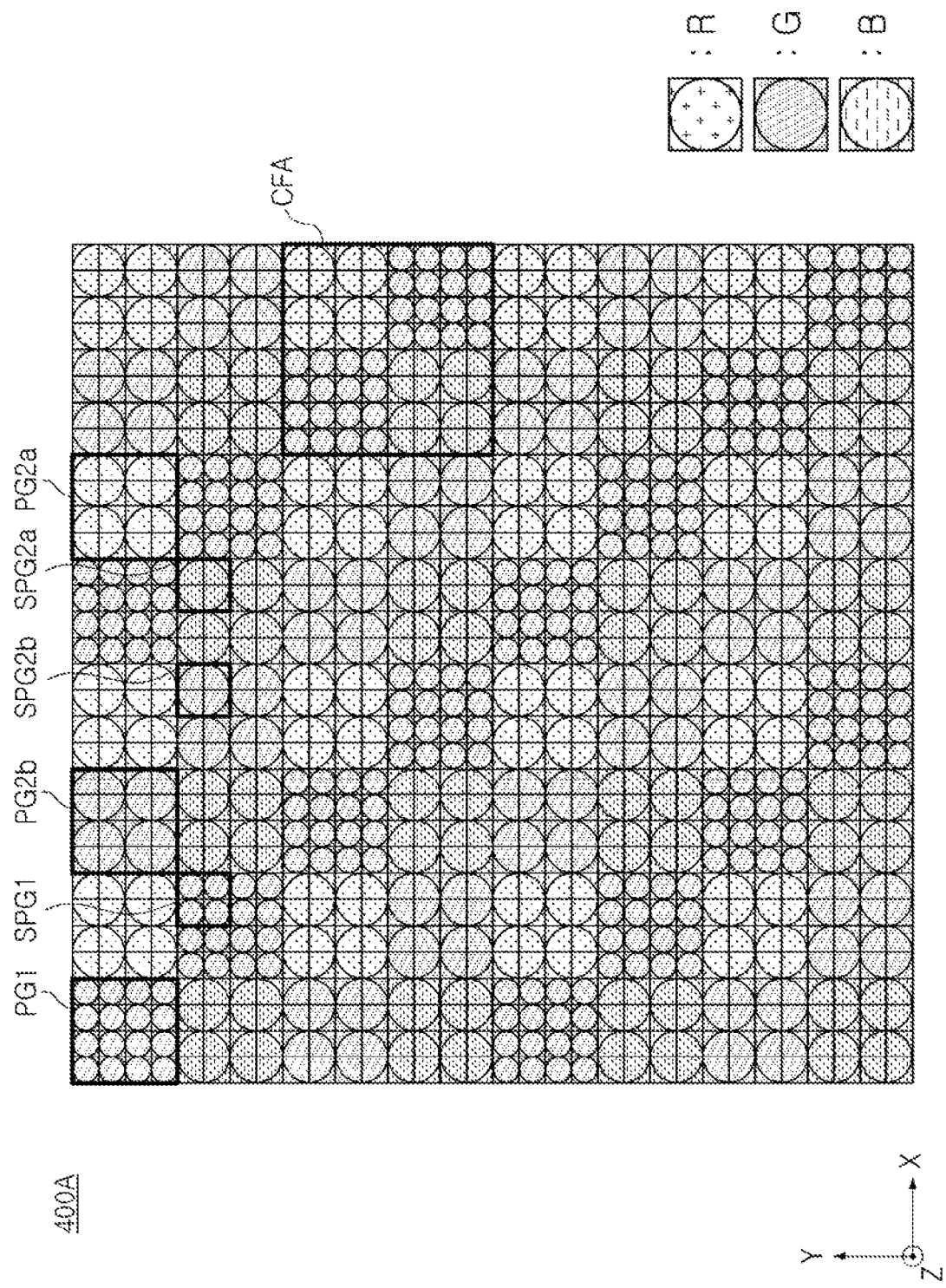

Referring to the pixel array 400A according to the example embodiment illustrated in FIG. 24, the second pixel groups PG2a and PG2b may include a color filter having any one of green, red, and blue colors.

For example, the first pixel group PG1 may include a green color filter. At least one second pixel group PG2a may include a red or blue color filter. However, at least another second pixel group PG2b may include a green color filter.

As described above, the first pixel groups PG1a and PG1b may include the first subpixel groups SPG1a and SPG1b and may include the first microlens ML1 disposed on the substrate. The second pixel group PG2 may include a second subpixel group SPG2 and may include a second microlens ML2 disposed on the substrate. Accordingly, in the image sensor including the pixel array 400A according to an example embodiment, autofocusing performance may be improved, but resolution of the generated image may be reduced when compared to the image sensor 100 illustrated in FIG. 5.

However, the shape of the pixel array included in the image sensor according to an example embodiment is not limited to those illustrated in FIGS. 21 to 24. As an example, the image sensor include first pixel groups PG1 and second pixel groups PG2 that are variously arranged to generate an image having appropriate resolution with appropriate autofocusing performance as necessary.

Figure 25:
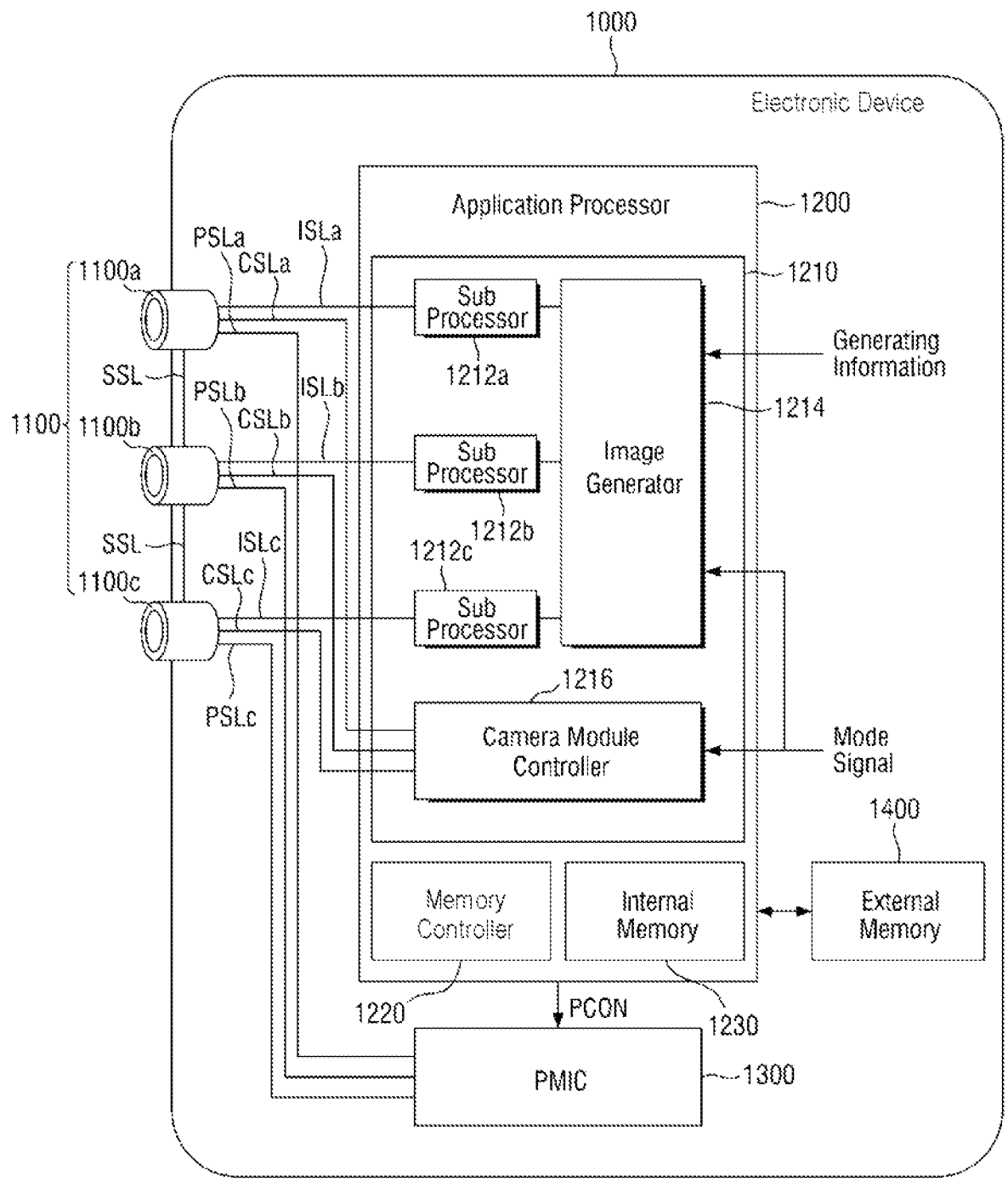
FIGS. 25 and 26 are views illustrating an electronic device including an image sensor according to an example embodiment.
Figure 26:
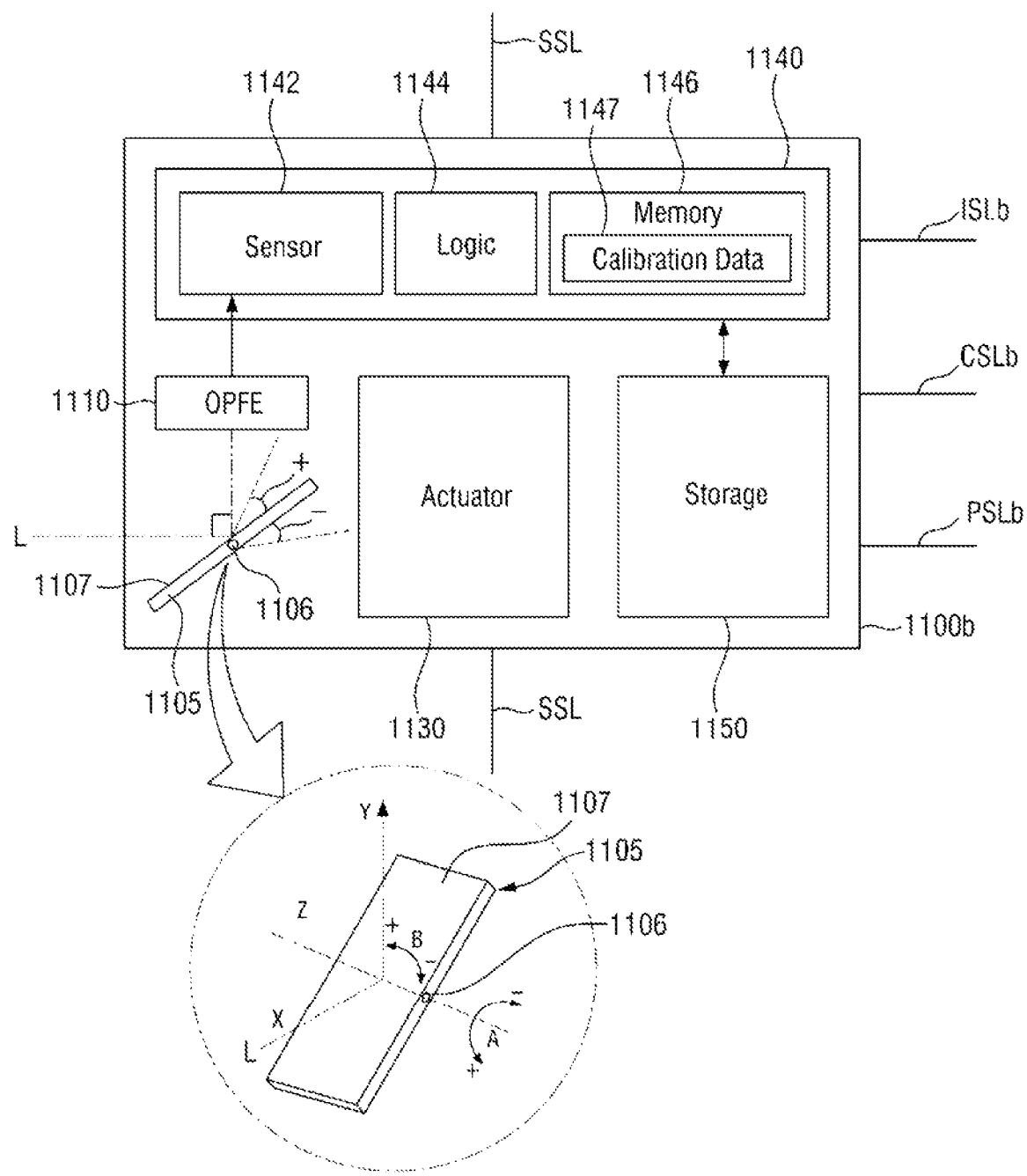

FIGS. 25 and 26 are diagrams illustrating an electronic device including an image sensor according to an example embodiment.

Referring to FIG. 25, an electronic device 1000 may include a camera module group 1100, an application processor 1200, a power management integrated circuit (PMIC) 1300, and an external memory 1400.

The camera module group 1100 may include a plurality of camera modules 1100a, 1100b, and 1100c. Although three camera modules 1100a, 1100b, and 1100c are disposed in the drawing, example embodiments are not limited thereto. In some example embodiments, the camera module group 1100 may be modified to include only two camera modules or only one camera module. Also, in some example embodiments, the camera module group 1100 may be modified to include n (n is a natural number of 4 or greater) camera modules. Also, in an example embodiment, at least one of the plurality of camera modules 1100a, 1100b, and 1100c included in the camera module group 1100 may include an image sensor according to one of the example embodiments described above with reference to FIGS. 1 to 24.

Hereinafter, a detailed configuration of the camera module 1100b will be described in more detail with reference to FIG. 26, and the following description will be equally applied to other camera modules 1100a and 1100b according to an example embodiment.

As illustrated in FIG. 26, the camera module 1100b may include a prism 1105, an optical path folding element (OPFE) 1110, an actuator 1130, an image sensing device 1140, and a storage 1150.

The prism 1105 may include a reflective surface 1107 of a light reflective material to modify a path of light L from the outside that is incident on the reflective surface 1107.

In some example embodiments, the prism 1105 may change a path of the light L incident in the second direction X to the third direction Y, perpendicular to the second direction X. In addition, the prism 1105 may rotate the reflective surface 1107 of the light reflective material about the central axis 1106 in an A direction or in a B direction to change a path of the light L incident in the second direction X into the vertical third direction Y. At this time, the OPFE 1110 may also move in the first direction Z, perpendicular to the second direction X and the third direction Y.

In some example embodiments, as shown, a maximum rotation angle of the prism 1105 in the A direction may be 15 degrees or less in a positive (+) A direction and may be greater than 15 degrees in a negative (−) A direction, but example embodiments are not limited thereto.

In some example embodiments, the prism 1105 may be movable at about 20 degrees, between 10 degrees and 20 degrees, or between 15 degrees and 20 degrees in a positive (+) or negative (−) B direction, and here, in the moving angle, the prism 1105 may move at the same angle in the positive (+) or negative (−) B direction or move to a nearly similar angle within a range of 1 degree.

In some example embodiments, the prism 1105 may move on the reflective surface 1107 of the light reflective material in the first direction (e.g., the Z direction), parallel to an extending direction of the central axis 1106.

The OPFE 1110 may include, for example, an optical lens including m (where m is a natural number) groups. The m lenses may move in the third direction Y to change an optical zoom ratio of the camera module 1100b. For example, when a basic optical zoom ratio of the camera module 1100b is Z, if m optical lenses included in the OPFE 1110 are moved, the optical zoom ratio of the camera module 1100b may be changed to 3Z or 5Z or higher than 5Z.

The actuator 1130 may move the OPFE 1110 or an optical lens (hereinafter referred to as an optical lens) to a specific position. For example, the actuator 1130 may adjust a position of the optical lens so that the image sensor 1142 is positioned at a focal length of the optical lens for accurate sensing.

The image sensing device 1140 may include an image sensor 1142, a control logic 1144, and a memory 1146. The image sensor 1142 may sense an image of a sensing target using light L provided through the optical lens. The control logic 1144 may control an overall operation of the camera module 1100b. For example, the control logic 1144 may control the operation of the camera module 1100b according to a control signal provided through a control signal line CSLb.

The memory 1146 may store information necessary for the operation of the camera module 1100b, such as calibration data 1147. The calibration data 1147 may include information necessary for the camera module 1100b to generate image data using the light L provided from the outside. The calibration data 1147 may include, for example, information on a degree of rotation, information on a focal length, and information on an optical axis, as described above. When the camera module 1100b is implemented as a multi-state camera in which the focal length is changed according to a position of the optical lens, the calibration data 1147 may include a focal length value of the optical lens for each position (or state) and information related to autofocusing.

The storage 1150 may store the image data sensed through the image sensor 1142. The storage 1150 may be disposed outside the image sensing device 1140 and may be implemented in a stacked form with a sensor chip constituting the image sensing device 1140. In some example embodiments, the storage 1150 may be implemented as an electrically erasable programmable read-only memory (EEPROM), but example embodiments are not limited thereto.

Referring to FIGS. 25 and 26 together, in some example embodiments, each of the plurality of camera modules 1100a, 1100b, and 1100c may include an actuator 1130. Accordingly, each of the plurality of camera modules 1100a, 1100b, and 1100c may include the same or different calibration data 1147 according to an operation of the actuator 1130 included therein.

In some example embodiments, one camera module (e.g., 1100b) among the plurality of camera modules 1100a, 1100b, and 1100c may be a folded lens type camera module including the prism 1105 and the OPFE 1110 described above and the other camera modules (e.g., 1100a and 1100c) may be vertical type camera modules without the prism 1105 and the OPFE 1110, but example embodiment are not limited thereto.

In some example embodiments, one camera module (e.g., 1100c) among the plurality of camera modules 1100a, 1100b, and 1100c may be a vertical type depth camera which extracts depth information using infrared (IR) rays. In this case, the application processor 1200 may generate a 3D depth image by merging image data provided from such a depth camera with image data provided from another camera module (e.g., 1100a or 1100b).

In some example embodiments, at least two camera modules (e.g., 1100a and 1100b) among the plurality of camera modules 1100a, 1100b, and 1100c may have different fields of view. In this case, for example, optical lenses of at least two camera modules (e.g., 1100a and 1100b) among the plurality of camera modules 1100a, 1100b, and 1100c may be different from each other, but example embodiments are not limited thereto.

Also, in some example embodiments, viewing angles of the plurality of camera modules 1100a, 1100b, and 1100c may be different from each other. In this case, the optical lenses included in each of the plurality of camera modules 1100a, 1100b, and 1100c may also be different, but example embodiments are not limited thereto.

In some example embodiments, each of the plurality of camera modules 1100a, 1100b, and 1100c may be disposed to be physically separated from each other. That is, instead of dividing the sensing area of one image sensor 1142 into areas for each of the plurality of camera modules 1100a, 1100b, and 1100c, an independent image sensor 1142 may be disposed inside each of the plurality of camera modules 1100a, 1100b, and 1100c.

Referring back to FIG. 25, the application processor 1200 may include an image processing device 1210, a memory controller 1220, and an internal memory 1230. The application processor 1200 may be implemented separately from the plurality of camera modules 1100a, 1100b, and 1100c. For example, the application processor 1200 and the plurality of camera modules 1100a, 1100b, and 1100c may be implemented separately as separate semiconductor chips.

The image processing device 1210 may include a plurality of sub-image processors 1212a, 1212b, and 1212c, an image generator 1214, and a camera module controller 1216.

The image processing device 1210 may include a plurality of sub-image processors 1212a, 1212b, and 1212c in a number corresponding to the number of the plurality of camera modules 1100a, 1100b, and 1100c.

Image data generated by each of the camera modules 1100a, 1100b, and 1100c may be provided to the corresponding sub-image processors 1212a, 1212b, and 1212c through image signal lines ISLa, ISLb, and ISLc separated from each other. For example, image data generated by the camera module 1100*a* may be provided to the sub-image processor 1212*a* through the image signal line ISLa, image data generated by the camera module 1100*b* may be provided to the sub-image processor 1212*b* through the image signal line ISLb, and image data generated by the camera module 1100*c* may be provided to the sub-image processor 1212*c* through the image signal line ISLc. Such image data transmission may be performed using, for example, a camera serial interface (CSI) based on a mobile industry processor interface (MIPI), but example embodiments are not limited thereto.

In some example embodiments, one sub-image processor may be disposed to correspond to a plurality of camera modules. For example, the sub-image processor 1212*a* and the sub-image processor 1212*c* are not implemented separately from each other as shown but may be integrated into one sub-image processor, and image data provided from the camera module 1100*a* and the camera module 1100*c* may be selected through a selecting element (e.g., a multiplexer) and provided to the integrated sub-image processor.

The image data provided to each sub-image processor 1212*a*, 1212*b*, and 1212*c* may be provided to the image generator 1214. The image generator 1214 may generate an output image using the image data provided from each of the sub-image processors 1212*a*, 1212*b*, and 1212*c* according to image generating information or a mode signal.

Specifically, the image generator 1214 may generate an output image by merging at least some of image data generated by the camera modules 1100*a*, 1100*b*, and 1100*c* having different viewing angles according to the image generating information or the mode signal. In addition, the image generator 1214 may generate an output image by selecting any one of image data generated by the camera modules 1100*a*, 1100*b*, and 1100*c* having different viewing angles according to image generating information or the mode signal.

In some example embodiments, the image generating information may include a zoom signal or zoom factor. Also, in some example embodiments, the mode signal may be, for example, a signal based on a mode selected by a user.

When the image generating information is a zoom signal (zoom factor) and each of the camera modules 1100*a*, 1100*b*, and 1100*c* has different viewing fields (viewing angles), the image generator 1214 may perform different operations according to types of the zoom signals. For example, when the zoom signal is a first signal, the image generator 1214 may merge image data output from the camera module 1100*a* and image data output from the camera module 1100*c* and then generate an output image using image data output from the camera module 1100*b* which has not been used for merging with the merged image signal. If the zoom signal is a second signal different from the first signal, the image generator 1214 may not perform such image data merging and may select any one of the image data output from each of the camera modules 1100*a*, 1100*b*, and 1100*c* to generate an output image. However, example embodiments are not limited thereto, and the method of processing image data may be modified and implemented as needed.

In some example embodiments, the image generator 1214 may receive a plurality of image data with different exposure times from at least one of the plurality of sub-image processors 1212*a*, 1212*b*, and 1212*c* and perform high dynamic range (HDR) processing to generate merged image data having an increased dynamic range.

The camera module controller 1216 may provide a control signal to each of the camera modules 1100*a*, 1100*b*, and 1100*c*. The control signal generated by the camera module controller 1216 may be provided to the corresponding camera modules 1100*a*, 1100*b*, and 1100*c* through the control signal lines CSLa, CSLb, and CSLc separated from each other.

Any one of the plurality of camera modules 1100*a*, 1100*b*, and 1100*c* may be designated as a master camera (e.g., 1100*b*) according to image generating information including a zoom signal or a mode signal, and the other camera modules (e.g., 1100*a* and 1100*c*) may be designated as slave cameras. Such information may be included in the control signal and provided to the corresponding camera modules 1100*a*, 1100*b*, and 1100*c* through the control signal lines CSLa, CSLb, and CSLc separated from each other.

The camera module operating as a master and a slave may be changed according to a zoom factor or an operation mode signal. For example, when a viewing angle of the camera module 1100*a* is wider than a viewing angle of the camera module 1100*b* and a zoom factor indicates a low zoom magnification, the camera module 1100*b* may operate as a master and the camera module 1100*a* may operate as a slave. Conversely, when the zoom factor indicates a high zoom magnification, the camera module 1100*a* may operate as a master and the camera module 1100*b* may operate as a slave.

In some example embodiments, the control signal provided to each of the camera modules 1100*a*, 1100*b*, and 1100*c* from the camera module controller 1216 may include a sync enable signal. For example, when the camera module 1100*b* is a master camera and the camera modules 1100*a* and 1100*c* are slave cameras, the camera module controller 1216 may transmit a sync enable signal to the camera module 1100*b*. The camera module 1100*b* receiving the sync enable signal may generate a sync signal based on the received sync enable signal and transmit the generated sync signal to the camera modules 1100*a* and 1100*c*. The camera module 1100*b* and the camera modules 1100*a* and 1100*c* may be synchronized with the sync signal to transmit image data to the application processor 1200.

In some example embodiments, the control signal provided from the camera module controller 1216 to the plurality of camera modules 1100*a*, 1100*b*, and 1100*c* may include mode information according to a mode signal. Based on the mode information, the plurality of camera modules 1100*a*, 1100*b*, and 1100*c* may operate in a first operation mode and a second operation mode in relation to a sensing rate.

The plurality of camera modules 1100*a*, 1100*b*, and 1100*c* may generate an image signal at a first rate (e.g., generate an image signal at a first frame rate) in the first operation mode, encode the generated image signal at a second rate higher than the first rate (e.g., encode the image signal at a second frame rate higher than the first frame rate), and transmit the encoded image signal to the application processor 1200. In this case, the second rate may be 30 times or less of the first rate.

The application processor 1200 may store the transmitted image signal, i.e., the encoded image signal, in the internal memory 1230 provided therein or an external memory 1400 outside the application processor 1200, and thereafter, the application processor 1200 may read the encoded image signal from the memory 1230 or the external memory 1400, decode the read image signal, and display image data generated based on the decoded image signal. For example, a corresponding sub-processor among the plurality of sub-image processors 1212*a*, 1212*b*, and 1212*c* of the image processing device 1210 may perform decoding and may also perform image processing on the decoded image signal.

The plurality of camera modules 1100a, 1100b, and 1100c may generate an image signal at a third rate lower than the first rate in the second operation mode (e.g., generate the image signal at a third frame rate lower than the first frame rate) and transmit the image signal to the application processor 1200. The image signal provided to the application processor 1200. The image signal provided to the application processor 1200 may be a signal which has not been encoded. The application processor 1200 may perform image processing on the received image signal or store the image signal in the memory 1230 or the external memory 1400.

The PMIC 1300 may supply power, e.g., a power supply voltage, to each of the plurality of camera modules 1100a, 1100b, and 1100c. For example, the PMIC 1300 may supply first power to the camera module 1100a through the power signal line PSLa, supply second power to the camera module 1100b through the power signal line PSLb, and supply third power to the camera module 1100c through the power signal line PSLc under the control of the application processor 1200.

In response to a power control signal PCON from the application processor 1200, the PMIC 1300 generates power corresponding to each of the plurality of camera modules 1100a, 1100b, and 1100c, and adjust a level of power. The power control signal PCON may include a power adjustment signal for each operation mode of the plurality of camera modules 1100a, 1100b, and 1100c. For example, the operation mode may include a low power mode, and in this case, the power control signal PCON may include information on a camera module operating in the low power mode and a set power level. The levels of power provided to each of the plurality of camera modules 1100a, 1100b, and 1100c may be the same or different from each other. Also, the levels of power may be changed dynamically.

As set forth above, the image sensor according to an example embodiment secures autofocusing in four directions using a first microlens corresponding to each of a plurality of photodiodes and a second microlens shared by the plurality of photodiodes, and may generate an image having a higher image quality than that of the related art image sensor.

The image sensor according to an example embodiment may include an overflow region for moving excessively generated electrical charges, thereby preventing saturation of the photodiodes due to the electrical charges generated in the photodiodes.

While example embodiments have been shown and described above, it will be apparent to those skilled in the art that modifications and variations could be made without departing from the scope of the appended claims.

What is claimed is:

1. An image sensor comprising:
    a substrate having a first surface and a second surface which faces the first surface;
    a pixel array comprising a plurality of first pixel groups and a plurality of second pixel groups, each of the plurality of first pixel groups and each of the plurality of second pixel groups comprising a plurality of unit pixels arranged in 4×4 array that extends in a second direction and in a third direction, each of the plurality of unit pixels comprising a photodiode provided in the substrate, and the plurality of first pixel groups and the plurality of second pixel groups being alternately disposed in the second direction and in the third direction;
    a logic circuit configured to acquire pixel signals from the plurality of unit pixels;
    a plurality of first microlenses, each of which is provided on a corresponding unit pixel of the plurality of unit pixels included in the plurality of first pixel groups; and
    a plurality of second microlenses, each of which is respectively provided on four corresponding unit pixels of the plurality of unit pixels included in the plurality of second pixel groups that are arranged in a 2×2 array,
    wherein a first direction is perpendicular to the first surface of the substrate, the second direction is parallel to the first surface of the substrate, and the third direction is parallel to the first surface of the substrate and perpendicular to the second direction,
    each of the plurality of first pixel groups and each of the plurality of second pixel groups comprises a device isolation layer provided between the plurality of unit pixels, and a color filter provided on the first surface,
    each of the plurality of second pixel groups comprises an overflow region configured to move electrical charges between adjacent photodiodes, and
    one of the plurality of first microlenses is adjacent a first one of the plurality of second microlenses in the second direction, and a second one of the plurality of second microlenses in the third direction.

2. The image sensor of claim 1, wherein a center of a second microlens of the plurality of second microlenses overlaps a floating diffusion region in the first direction.

3. The image sensor of claim 1, wherein a center of a first microlens of the plurality of first microlenses overlaps the photodiode below the first microlens in the first direction.

4. The image sensor of claim 1, wherein the color filter corresponding to each of the plurality of unit pixels in each pixel group of the plurality of first pixel groups and the plurality of second pixel groups share a common color.

5. The image sensor of claim 4, wherein the color filter corresponding to each of the plurality of unit pixels in the plurality of first pixel groups is green, and the color filter corresponding to each of the plurality of unit pixels in the plurality of second pixel groups is red or blue.

6. The image sensor of claim 4, wherein the color filter corresponding to each of the plurality of unit pixels in the plurality of first pixel groups is red or blue, and the color filter corresponding to each of the plurality of unit pixels in the plurality of second pixel groups is green.

7. The image sensor of claim 1, wherein the plurality of unit pixels share a floating diffusion region at every 2×2 array.

8. The image sensor of claim 1, wherein the plurality of unit pixels included in the plurality of second pixel groups comprise an autofocusing pixel.

9. The image sensor of claim 8, wherein the logic circuit is configured to perform autofocusing based on the pixel signals acquired from the autofocusing pixel with respect to the second direction and the third direction.

10. The image sensor of claim 1, wherein each of the plurality of unit pixels in the plurality of second pixel groups is configured to accumulate a greater amount of electrical charges than a maximum amount of electrical charges that may be accumulated in each of the plurality of unit pixels in the plurality of first pixel groups.

11. The image sensor of claim 1, wherein adjacent portions of the device isolation layer extending in the second direction in the plurality of first pixel groups are closer to each other than adjacent portions of the device isolation layer extending in the second direction in the plurality of second pixel groups.

12. An image sensor comprising:
a substrate having a first surface and a second surface which faces the first surface;
a pixel array comprising a plurality of first pixel groups and a plurality of second pixel groups, each of the plurality of first pixel groups and the plurality of second pixel groups comprising a plurality of unit pixels defined by a device isolation layer extending through the substrate in a first direction, the plurality of unit pixels in each of the plurality of first pixel groups and the plurality of second pixel groups being arranged in 4×4 array that extends in a second direction and in a third direction, each of the plurality of unit pixels comprising a photodiode provided inside the substrate, and the plurality of first pixel groups and the plurality of second pixel groups being alternately disposed in the second direction and in the third direction;
a logic circuit configured to acquire pixel signals from the plurality of unit pixels;
a plurality of first microlenses having a first diameter and respectively corresponding to the plurality of unit pixels are disposed on an upper surface of the plurality of first pixel groups; and
a plurality of second microlenses having a second diameter greater than the first diameter are disposed on an upper surface of the plurality of second pixel groups,
wherein the first direction is perpendicular to the first surface of the substrate, the second direction is parallel to the first surface of the substrate, and the third direction is parallel to the first surface of the substrate and perpendicular to the second direction,
a pixel signal acquired from unit pixels of the plurality of unit pixels sharing one of the plurality of second microlenses comprises an autofocusing pixel signal with respect to the second direction and the third direction, and
one of the plurality of first microlenses is adjacent a first one of the plurality of second microlenses in the second direction, and a second one of the plurality of second microlenses in the third direction.

13. The image sensor of claim 12, wherein each of the plurality of second pixel groups comprises an overflow region configured to move electrical charges between adjacent photodiodes.

14. The image sensor of claim 12, wherein adjacent portions of the device isolation layer extending in the second direction in the plurality of first pixel groups are closer to each other than adjacent portions of the device isolation layer extending in the second direction in the plurality of second pixel groups.

15. An image sensor comprising:
a substrate having a first surface and a second surface which faces the first surface;
a pixel array comprising a plurality of first pixel groups and a plurality of second pixel groups, each of the plurality of first pixel groups and the plurality of second pixel groups comprising a plurality of unit pixels defined by a device isolation layer extending through the substrate in a first direction, the plurality of unit pixels in each of the plurality of first pixel groups and the plurality of second pixel groups being arranged in 4×4 array that extends in a second direction and in a third direction, each of the plurality of unit pixels comprising a photodiode provided inside the substrate, and the plurality of first pixel groups and the plurality of second pixel groups being alternately disposed in the second direction and in the third direction;
a logic circuit configured to acquire pixel signals from the plurality of unit pixels;
a plurality of first microlenses having a first diameter and respectively corresponding to the plurality of unit pixels are disposed on an upper surface of the plurality of first pixel groups; and
a plurality of second microlenses having a second diameter greater than the first diameter are disposed on an upper surface of the plurality of second pixel groups,
wherein the first direction is perpendicular to the first surface of the substrate, the second direction is parallel to the first surface of the substrate, and the third direction is parallel to the first surface of the substrate and perpendicular to the second direction, and
a pixel signal acquired from unit pixels of the plurality of unit pixels sharing one of the plurality of second microlenses comprises an autofocusing pixel signal with respect to the second direction and the third direction,
wherein each of the plurality of first pixel groups and the plurality of second pixel groups comprises a plurality of floating diffusion regions,
the device isolation layer is separated from each of the plurality of floating diffusion regions, and
adjacent portions of the device isolation layer extending in the second direction in the plurality of first pixel groups are closer to each other than adjacent portions of the device isolation layer extending in the second direction in the plurality of second pixel groups.

* * * * *